United States Patent
Wu et al.

(10) Patent No.: US 12,324,109 B2
(45) Date of Patent: Jun. 3, 2025

(54) ELECTRONIC DISPLAY BOARD SYSTEM, ELECTRONIC DISPLAY BOARD, AND SUPPORT STAGE

(71) Applicant: BOE Technology Group Co., Ltd., Beijing (CN)

(72) Inventors: Yunpeng Wu, Beijing (CN); Lei Cao, Beijing (CN); Yao Zhang, Beijing (CN); Qiang Wang, Beijing (CN); Shijie Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 165 days.

(21) Appl. No.: 17/770,219

(22) PCT Filed: May 20, 2021

(86) PCT No.: PCT/CN2021/094736
§ 371 (c)(1),
(2) Date: Apr. 19, 2022

(87) PCT Pub. No.: WO2021/258931
PCT Pub. Date: Dec. 30, 2021

(65) Prior Publication Data
US 2022/0400563 A1    Dec. 15, 2022

(30) Foreign Application Priority Data
Jun. 24, 2020 (CN) .......................... 202010591770.3

(51) Int. Cl.
*H05K 5/02* (2006.01)
*G09F 3/20* (2006.01)
*G09F 9/30* (2006.01)

(52) U.S. Cl.
CPC ........... *H05K 5/0217* (2013.01); *G09F 3/208* (2013.01); *G09F 9/30* (2013.01)

(58) Field of Classification Search
CPC .. H05K 5/0217; H05K 5/0017; H05K 5/0086; H05K 5/0234; G09F 3/208;
(Continued)

(56) References Cited

U.S. PATENT DOCUMENTS 6,870,732 B2    3/2005  Huang et al.
9,312,633 B1 *  4/2016  Szeto ................. H01R 13/6205
(Continued)

FOREIGN PATENT DOCUMENTS

CN      203433420 U    2/2014
CN      205942517 U    2/2017
(Continued)

OTHER PUBLICATIONS

Mar. 19, 2024—(CN) Notice of First Office Action—App 202010591770.3, pp. 1-13.
(Continued)

*Primary Examiner* — Anthony M Haughton
*Assistant Examiner* — Theron S Milliser
(74) *Attorney, Agent, or Firm* — Banner & Witcoff, Ltd.

(57) ABSTRACT

An electronic display board system, an electronic display board and a support platform are provided. The electronic display board includes a display panel, a housing and a first magnetic attraction structure. The display panel includes a display surface on a display side; the housing is connected to the display panel, and includes a first connecting surface on a side away from the display panel, and the first connecting surface and the display surface have a first angle; and the first magnetic attraction structure is fixed on the housing and located between the first connecting surface and the display panel, the first magnetic attraction structure includes a first magnetic attraction portion and a second magnetic attraction portion configured to attract each other upon approaching each other.

20 Claims, 11 Drawing Sheets

(58) Field of Classification Search
CPC ........ G09F 9/30; G09F 23/06; F16B 2200/83; F16B 5/00; F16M 11/041; F16M 11/10; F16M 13/022; F16M 13/005
See application file for complete search history.

(56) References Cited

U.S. PATENT DOCUMENTS

| | | | | |
|---|---|---|---|---|
| 9,645,608 | B1* | 5/2017 | Tsai | G06F 1/1632 |
| 10,345,866 | B2* | 7/2019 | Tucker | E05D 1/06 |
| 10,394,277 | B2* | 8/2019 | Kim | G06F 1/1675 |
| 10,459,493 | B2* | 10/2019 | Lee | H04M 1/0214 |
| 10,831,244 | B1* | 11/2020 | DeMaio | G06F 1/1626 |
| 10,860,274 | B2* | 12/2020 | Son | G06F 1/1681 |
| 10,912,213 | B2* | 2/2021 | Woo | G06F 1/1679 |
| 11,210,970 | B2 | 12/2021 | Xiang et al. | |
| 11,237,600 | B2* | 2/2022 | DeMaio | G06F 1/1656 |
| 11,422,593 | B2* | 8/2022 | Perelli | G06F 1/1649 |
| 11,833,443 | B2* | 12/2023 | Yamaai | A63H 33/046 |
| 2010/0230561 | A1* | 9/2010 | Chang | F16M 13/00 248/183.3 |
| 2013/0258212 | A1 | 10/2013 | Ooe et al. | |
| 2014/0254077 | A1 | 9/2014 | Griffin | |
| 2016/0111815 | A1* | 4/2016 | Szeto | H01R 43/16 439/39 |
| 2017/0153665 | A1* | 6/2017 | Tsai | G06F 1/1669 |
| 2017/0257146 | A1* | 9/2017 | Szeto | H04W 4/80 |
| 2017/0310042 | A1* | 10/2017 | Michelmann | H04M 1/0216 |
| 2017/0358636 | A1 | 12/2017 | Kim et al. | |
| 2018/0224897 | A1* | 8/2018 | Tucker | E05D 3/122 |
| 2018/0335800 | A1* | 11/2018 | Kim | H05K 5/0017 |
| 2018/0356864 | A1* | 12/2018 | Lee | E05D 1/00 |
| 2019/0004764 | A1* | 1/2019 | Son | G06F 1/1616 |
| 2019/0200470 | A1* | 6/2019 | Woo | G06F 1/1681 |
| 2020/0150728 | A1* | 5/2020 | Escolin | G06F 1/1669 |
| 2021/0081008 | A1* | 3/2021 | DeMaio | G06F 1/1656 |
| 2021/0213369 | A1* | 7/2021 | Yamaai | A63H 33/042 |
| 2022/0137672 | A1* | 5/2022 | Perelli | G06F 1/1641 361/679.28 |
| 2023/0053520 | A1* | 2/2023 | Yamaai | A63H 33/046 |
| 2023/0332737 | A1* | 10/2023 | Wu | G09F 9/30 |

FOREIGN PATENT DOCUMENTS

| | | |
|---|---|---|
| CN | 106847099 A | 6/2017 |
| CN | 206921382 U | 1/2018 |
| CN | 107864350 A | 3/2018 |
| CN | 107995809 A | 5/2018 |
| CN | 207319607 U | 5/2018 |
| CN | 110622104 A | 12/2019 |
| CN | 10429078 U | 4/2020 |
| CN | 210244897 U | 4/2020 |
| CN | 210402974 U | 4/2020 |
| CN | 210462222 U | 5/2020 |
| CN | 111594514 A | 8/2020 |
| TW | 587794 U | 5/2004 |

OTHER PUBLICATIONS

Mar. 19, 2024—(CN) Notice of First Office Action—App 202010591770.3—partial English translation.

Dec. 26, 2024—(CN) Notice of Third Office Action—App 202010591770.3—English translation.

* cited by examiner

ELECTRONIC DISPLAY BOARD SYSTEM, ELECTRONIC DISPLAY BOARD, AND SUPPORT STAGE

The application is a U.S. National Phase Entry of International Application PCT/CN2021/094736 filed on May 20, 2021, designating the United States of America and claiming priority to Chinese Patent Application No. 202010591770.3, filed Jun. 24, 2020. The present application claims priority to and the benefit of the above-identified applications and the above-identified applications are incorporated by reference herein in their entirety.

TECHNICAL FIELD

Embodiments of the present disclosure relate to an electronic display board system, an electronic display board and a support platform.

BACKGROUND

At present, there are many scenarios in the market that require the use of electronic display boards, also known as electronic display screens, electronic signages, electronic labels, etc., to display the price of goods, the introduction content of exhibits, the information of conference personnel and so on. This type of electronic display board often needs to be placed with a single electronic board or two electronic display boards back-to-back.

For example, at the meeting site, table boards need to be placed to display information such as the names of the participants. The commonly used table boards are paper table boards, while the use of paper table boards will cause waste of resources. At present, there are also some electronic display table boards on the market, which are convenient and quick to change the information of participants and save resources.

SUMMARY

The Summary of the present disclosure provides some embodiments in a simplified manner, and more detailed embodiments are described in the Detail Description. The Summary is not intended to exclusively identify the key features or necessary features of the claimed subject matter, nor is it intended to help determine the scope of the claimed subject matter.

In some embodiments, the disclosure provides an electronic display board system, an electronic display board and a support platform. The electronic display board includes a display panel, a housing and a first magnetic attraction structure. The display panel includes a display surface on a display side; the housing is connected to the display panel, and comprises a first connecting surface on a side away from the display panel, and the first connecting surface and the display surface have a first angle; and the first magnetic attraction structure is fixed on the housing and located between the first connecting surface and the display panel, the first magnetic attraction structure comprises a first magnetic attraction portion and a second magnetic attraction portion configured to attract each other upon approaching each other. The electronic display board can connect two electronic display boards together through the first magnetic suction structure. After the two electronic display boards are connected together, they can support each other, so as to be stably placed on the desktop, ground and other platforms.

An embodiment of the disclosure provides an electronic display board system, comprising two electronic display boards, wherein each of the electronic display boards comprises: a display panel, comprising a display surface on a display side; a housing, connected to the display panel, comprising a connecting surface on a side away from the display panel, and the connecting surface and the display surface having a non-zero first angle or being arranged in parallel; and a magnetic attraction structure, located between the connecting surface and the display panel, and comprising a first magnetic attraction portion and a second magnetic attraction portion, wherein the first magnetic attraction portion of one of the two electronic display boards and the second magnetic attraction portion of the other one of the two electronic display boards are configured to attract each other upon approaching each other, and the second magnetic attraction portion of one of the two electronic display boards and the first magnetic attraction portion of the other one of the two electronic display boards are configured to attract each other upon approaching each other.

An embodiment of the disclosure provides an electronic display board, used for connecting with another electronic display board through magnetic attraction, comprising: a display panel, comprising a display surface on a display side; a housing, connected to the display panel, and comprising a first connecting surface on a side away from the display panel, and the first connecting surface and the display surface having a non-zero first angle or being arranged in parallel; and a first magnetic attraction structure, located between the first connecting surface and the display panel, the first magnetic attraction structure comprising a first magnetic attraction portion and a second magnetic attraction portion, the first magnetic attraction portion is configured for mutual attraction with the second magnetic portion of another electronic display board upon approaching it, and the second magnetic attraction portion is configured for mutual attraction with the first magnetic attraction portion of another electronic display board upon approaching it.

In some examples, the electronic display board further comprises: a positioning structure, located on a side of the first connecting surface away from the display panel, the positioning structure comprising a first protrusion and a first groove, and the first protrusion having a shape and a size matched with those of the first groove.

In some examples, the display panel is configured to display image, and a connecting line between a center of the first protrusion and a center of the first groove is substantially parallel to an upper side of the image, distances from a midpoint of the connecting line to two edges of the electronic display board opposite to each other in a direction of an intersection line are approximately equal to each other.

In some examples, the display panel is configured to display image, a connecting line between a center of the first magnetic attraction portion and a center of the second magnetic attraction portion is substantially parallel to an upper side of the image, and distances from a midpoint of the connecting line to two edges of the electronic display board opposite to each other in a direction of an intersection line are approximately equal to each other.

In some examples, in a direction perpendicular to the first connecting surface, the first protrusion at least partially overlaps the first magnetic attraction portion, and the first groove at least partially overlaps the second magnetic attraction portion.

In some examples, in the direction perpendicular to the first connecting surface, an orthographic projection of the first protrusion on the first connecting surface falls within an orthographic projection of the first magnetic attraction portion on the first connecting surface, an orthographic projection of the first groove on the first connecting surface falls within an orthographic projection of the second magnetic attraction portion on the first connecting surface.

In some examples, the first included angle has a value in a range greater than 0 degrees and less than or equal to 45 degrees.

In some examples, the first included angle has the value in a range greater than 0 degrees and less than or equal to 15 degrees.

In some examples, the first magnetic attraction portion and the second magnetic attraction portion are two magnets which have south pole-to-north pole orientations substantially perpendicular to the first connecting surface and opposite to each other; or, the first magnetic attraction portion and the second magnetic attraction portion are two poles of a same bar magnet, respectively; or, the first magnetic attraction portion and the second magnetic attraction portion are respectively a magnet and a component comprising a ferromagnetic material.

In some examples, the housing further comprises a second connecting surface on a surface of the housing away from the display panel, the second connecting surface and the display surface have a second included angle β, and an intersection line of a plane in which the second connecting surface is located and a plane in which the display surface is located is parallel to an intersection line of a plane in which the first connecting surface is located and a plane in which the display surface is located.

In some examples, the electronic display board further comprises a second magnetic attraction structure, fixed to the housing and is located between the second connecting surface and the display panel, the second magnetic attraction structure comprising a third magnetic attraction portion and a fourth magnetic attraction portion, configured to attract each other upon approaching each other.

In some examples, the electronic display board further comprises: a bracket, comprising a rotation shaft at a first end portion, and hinged with the housing through the rotation shaft at the second connecting surface; and a limiting device, configured to fix the bracket at a first position and a second position, wherein the first position is a position where a second end portion of the bracket opposite to the first end portion is close to the second connecting surface, and the second position is a position where the second end portion of the bracket is away from the second connecting surface.

In some examples, the limiting device comprises a second protrusion and a second groove, and the second protrusion has a shape and a size matched with those of the second groove, the second protrusion is located at one of a surface of the first end portion of the bracket and the housing, and the second groove is located at the other one of the surface of the first end portion of the bracket and the housing.

In some examples, the second groove is located at the surface of the first end portion of the bracket, and comprises a first sub-groove and a second sub-groove, the first sub-groove and the second sub-groove are rotationally distributed in 90-degree around the rotation shaft, and are respectively matched with the second protrusion to define the first position and the second position of the bracket.

In some examples, the second protrusion is located on the housing, the housing comprises an opening at a position corresponding to the second protrusion, and the second protrusion comprises a folding elastic piece protruding through the opening from the side of the housing away from the second connecting surface to the second connecting surface.

In some examples, the housing comprises a rotation hole, and at least part of the rotation shaft is located in the rotation hole, the second protrusion is located on the rotation shaft, and the second groove is located on a wall surface of the rotation hole.

In some examples, the second groove comprises a first sub-groove and a second sub-groove, the first sub-groove and the second sub-groove are rotationally distributed in 90-degree around the rotation shaft, and are respectively matched with the second protrusion to define the first position and the second position of the bracket.

In some examples, the housing comprises a receiving groove, recessed toward the display surface at the second connecting surface, in a state that the bracket is at the first position, the bracket is located in the receiving groove, an orthographic projection of the bracket on the second connecting surface is within an orthographic projection of the receiving groove on the second connecting surface.

In some examples, the bracket comprises an inclined surface at a corner of the second end portion away from the first connecting surface, in a state that the bracket is at the second position, the inclined surface and an edge of the electronic display board away from the first connecting surface are substantially in a same plane.

In some examples, the display panel comprises an electronic ink screen or an electronic paper, and the electronic display board is an electronic table board or a workstation board.

In some examples, at least one of a portion where the display surface is connected to the first connection surface and a portion where the display surface is connected to the second connection surface has an anti-skid pad.

An embodiment of the disclosure provides a support platform, comprising: two supporting structures, wherein each of the supporting structures comprises: a support main body portion, comprising a connecting surface and a supporting surface, the connecting surface and the supporting surface having an included angle; and a magnetic attraction structure, fixed on a side of the connecting surface close to the supporting surface, comprising a first magnetic attraction portion and a second magnetic attraction portion, wherein the first magnetic attraction portion of one of the two supporting structures and the second magnetic attraction portion of the other one of the two supporting structures are configured to attract each other upon approaching each other, and the second magnetic attraction portion of one of the two supporting structures and the second magnetic attraction portion of the other one of the two supporting structures are configured to attract each other upon approaching each other.

An embodiment of the disclosure provides an electronic display board system, comprising a first electronic display board and a second electronic display board, wherein the first electronic display board comprises: a display panel; a housing, connected to the display panel and comprising a housing main body portion located on a non-display side of the display panel; and a first magnetic attraction structure, located between the housing main body portion and the display panel, the second electronic display board comprises: a display panel; a housing, connected with the display panel and comprising a housing main body portion on a non-display side of the display panel; and a second magnetic attraction structure, located between the housing main body portion and the display panel, the first magnetic attraction structure and the second magnetic attraction structure are configured to attract each other upon approaching each other.

In some examples, a number of the first electronic display boards is one or more, and the display sides of the one or more first electronic display boards face towards a same direction; a number of the second electronic display boards is one or more, and the display side of the one or more second electronic display boards face towards an opposite direction; upon the first electronic display board and the second electronic display board being placed back-to-back, the first magnetic attraction structure and the second magnetic attraction structure are configured to attract each other upon approaching each other.

In some examples, the housing is integrated with the display panel, the housing is an outer surface of the display panel, the first magnetic attraction structure or the second magnetic attraction structure is located at an inner side of the outer surface of the display panel; or the housing is a housing independent of the display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the invention.

DETAILED DESCRIPTION

Figure 1:
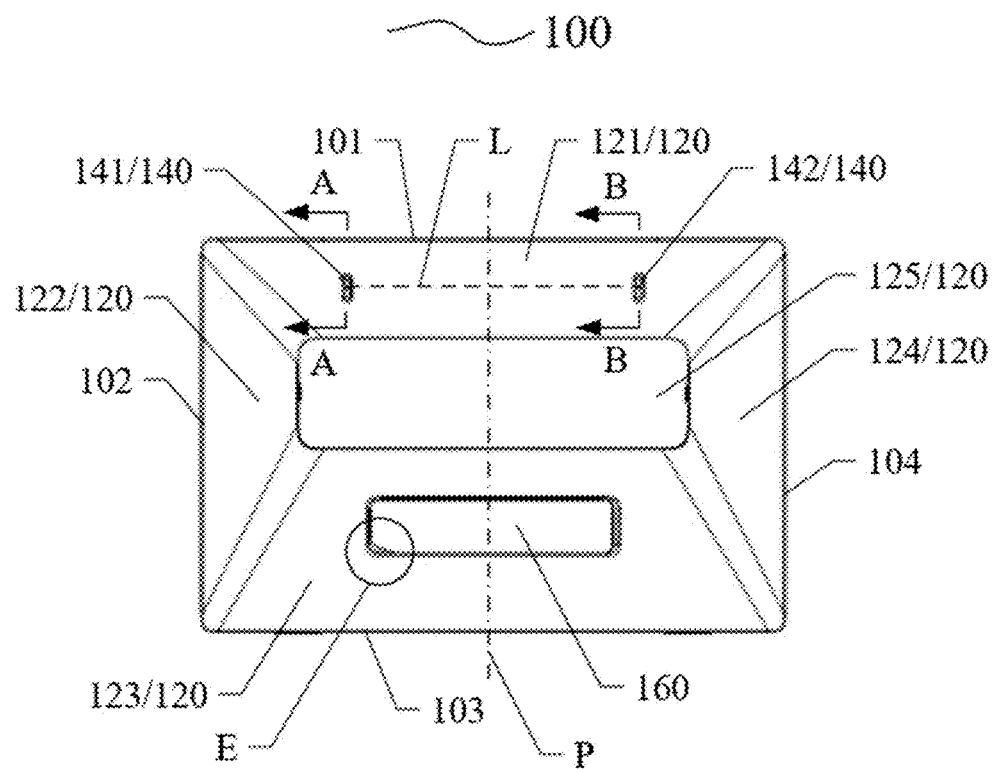
FIG. 1 is a schematic diagram of a plane structure of an electronic display board according to an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

Embodiments of the present disclosure provide at least an electronic display board system, an electronic display board, and a support system.

Electronic display boards, also known as electronic display screens, electronic signages, electronic labels, etc., have different product names in different application scenarios, and the following application scenarios are provided exemplarily but are not limited to this. Electronic display boards are used to display the price of goods, and the corresponding products are electronic price labels; electronic display boards are used to display the introduction content of exhibits, such as electronic exhibition boards; electronic display boards are used to be set on a table or other supporting surface to display the information of conference personnel etc., and the corresponding products can be called table boards. For the convenience of description, the following expressions in this application are uniformly based on the electronic display board.

This type of electronic display board often needs to be placed with a single electronic board alone or two electronic display boards back-to-back, and the back-to-back placement constitutes a system including two electronic display boards, which is referred to as an electronic display board system. The single electronic board display can be placed by means of legs or brackets. The two electronic display boards placed back-to-back can be supported by themselves or by a bracket, and different embodiments can be implemented in different application scenarios or different needs of users.

Of course, the number of electronic display boards placed back-to-back may not be limited to two, for example, a plurality of electronic display boards facing towards one direction and another one or more electronic display boards facing the opposite direction are arranged back-to-back.

In the above-mentioned embodiments, the back-to-back placement can be connected by the magnetic attraction structure arranged on each electronic display board.

Some embodiments of the present disclosure provide an electronic display board system, comprising two electronic display boards. Each of the electronic display boards comprises: a display panel, comprising a display surface on the display side; the display panel can be a display screen based on the principles of liquid crystal, OLED, or electronic ink, and can be a rigid or a flexible display screen.

Each electronic display board of the above-mentioned embodiments further comprises: a case, connected to the display panel, and comprising a connecting surface on a side away from the display panel, the connecting surface and the display surface having a non-zero first angle or being arranged in parallel; and a magnetic attraction structure, located between the connecting surface and the display panel, and the magnetic attraction structure comprising a first magnetic attraction portion and a second magnetic attraction portion. The first magnetic attraction portion of one of the two electronic display boards and the second magnetic attraction portion of the other one of the two electronic display boards are configured to attract each other upon approaching each other, and the second magnetic attraction portion of one of the two electronic display boards and the first magnetic attraction portion of the other one of the two electronic display boards are configured to attract each other upon approaching each other.

The display panel comprises a display surface on the display side, a back surface on the non-display side, and a side surface for connecting the display surface and the back surface. For example, a rectangular display panel generally has four sides. The connecting surface on the side away from the display panel is located on the back surface of the display panel, and is used to be connected with another electronic display board in the electronic display board system, so it is called the connecting surface. In the case where the electronic display board is used independently, the connecting surface is a portion of the housing, and plays the role of protecting the display panel.

It should be noted that the first magnetic attraction portion and the second magnetic attraction portion belonging to different electronic display boards being configured to attract each other upon being close to each other represents that the properties of the first magnetic attraction portion and the second magnetic attraction portion, and it does not mean that the two magnetic portions of the same electronic display board attract each other. In the case that two electronic display boards are attached back-to-back, the first magnetic portion of one electronic display board and the second magnetic portion of the other electronic display board attract each other, and the second magnetic attraction portion of the one electronic display board and the first magnetic attraction portion of the other electronic display board attract each other. The magnetic pole orientations of the first magnetic attraction portion and the second magnetic attraction portion of the same electronic display board may be the same or opposite.

In some embodiments, magnetic pole orientations of the first magnetic attraction portion and the second magnetic attraction portion of the same electronic display board are opposite. And the relative positions of the first magnetic attraction portion and the second magnetic attraction portion of different electronic display boards are similar, so that in the case that the first magnetic attraction portion and the second magnetic attraction portion of two electronic display boards are correspondingly approached, they attract each other due to the different magnetic pole orientations. In this way, in the case that a large number of electronic display boards are made into similar relative positions of the first magnetic portion and the second magnetic portion, any two electronic display boards can be arranged back-to-back with the first magnetic portion and the second magnetic portion attracting each other.

The magnetic pole orientation refers to the pointing direction of the N pole or the S pole. For example, the magnetic pole orientations of the first magnetic attraction portion and the second magnetic attraction portion of the same electronic display board can be realized as, the N pole of the first magnetic attraction portion points to the display surface, and the N pole of the second magnetic attraction portion points to the back surface. Of course, the magnetic pole orientations of the first magnetic attraction portion and the second magnetic attraction portion are not limited to this.

The electronic display board in the above-mentioned electronic display board system will be further described.

The electronic display board system takes two electronic display boards with back-to-back arrangement as an example, and each electronic display board will be described in detail below. Of course, the following embodiments can be used for the display surfaces of a plurality of electronic display boards to be arranged in one direction, and the display surfaces of one or more other electronic display boards are arranged in an opposite direction.

Figure 2:
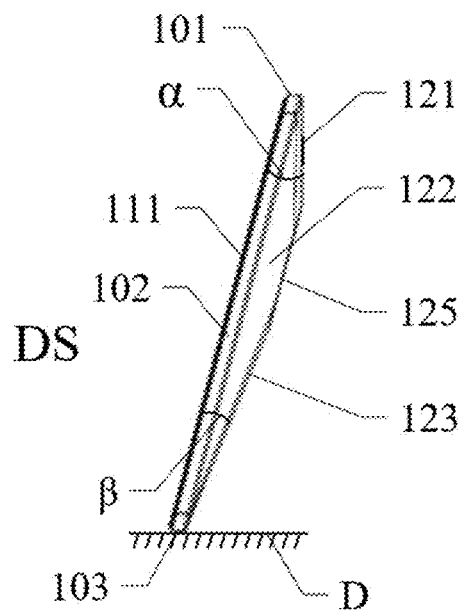
FIG. 2 is another schematic diagram of a plane structure of an electronic display board according to an embodiment of the present disclosure.
Figure 3:
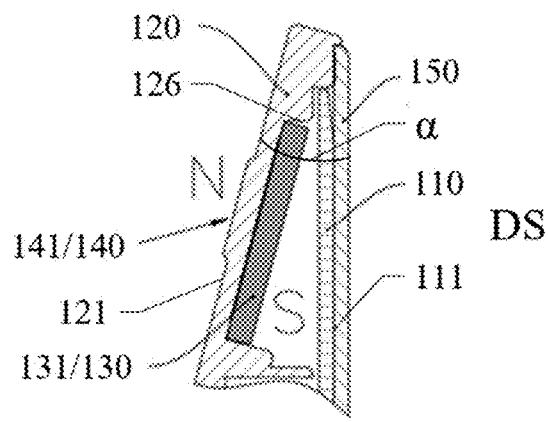
FIG. 3 is a partial cross-sectional structural schematic diagram taken along the line A-A of FIG. 1.
Figure 4:
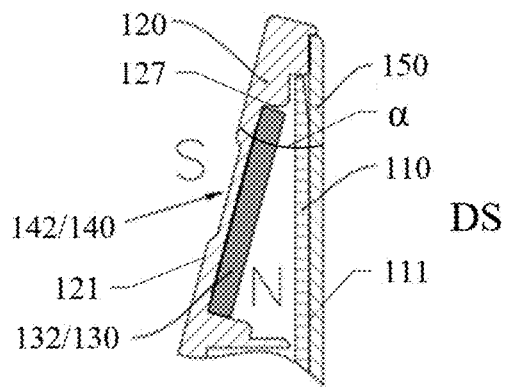
FIG. 4 is a partial cross-sectional structural schematic diagram taken along the line B-B of FIG. 1.

An embodiment of the present disclosure provides an electronic display board for connecting with another electronic display board by means of magnetic attraction. FIG. 1 is a schematic diagram of a plane structure of an electronic display board according to an embodiment of the present disclosure; FIG. 2 is another schematic diagram of a plane structure of an electronic display board according to an embodiment of the present disclosure; FIG. 3 is a partial cross-sectional structural schematic diagram taken along the line A-A of FIG. 1. FIG. 4 is a partial cross-sectional structural schematic diagram taken along the line B-B of FIG. 1.

As illustrated in FIG. 1-FIG. 4, the electronic display board 100 comprises a display panel 110, a case 120 and a first magnetic attraction structure 130. The display panel 110 has a display surface 111 on a display side DS. The case 120 is connected to the display panel 110 and exposes the display surface of the display panel. The case 120 has a first connecting surface 121 on a side away from the display panel 110, and a first included angle α exists between the first connecting surface 121 and the display surface 111. The first magnetic attraction structure 130 is fixed on the case 120 and is located between the first connecting surface 121 and the display panel 110. The first magnetic attraction structure 130 comprises a first magnetic attraction portion 131 and a second magnetic attraction portion 132, and the first magnetic attraction portion 131 and the second magnetic attraction portion 132 are configured to attract each other in the case that they are close to each other, for example, the magnetic polarities of the first magnetic attraction portion 131 and the second magnetic attraction portion 132 are opposite. The magnetic attraction portion is a magnetic structure formed by a magnet, a magnetic-iron or a magnetic material which has a magnetic attraction property with another magnetic attraction portion.

It should be noted that the first included angle α may be an acute angle, a right angle or an obtuse angle, or may be 0 degrees. In some embodiments, in the case that the first included angle α is 0 degrees, the first connecting surface 121 is arranged in parallel with the display surface 111. For example, the electronic display board is a workstation board, and two workstation boards connected by a magnetic structure can be placed between two office desks facing to each other. Or in a museum scene, in the case that two adjacent exhibits need to be introduced, the electronic display boards are two electronic display boards connected by a magnetic attraction structure and are placed back-to-back. In the case that the electronic display boards with the first included angle α being 0 degrees are combined and are difficult to be placed on a supporting surface, a bracket can be provided at the position where the electronic display board system contacts the desktop to increase the placement stability. Or it can be directly inserted in some gap that can be inserted between two electronic display boards.

In some embodiments, no gap may be set between two electronic display boards, and the two electronic display boards are supported by other brackets.

The electronic display board provided by the embodiments of the present disclosure can realize the function of connecting two electronic display boards together through the first magnetic attraction structure, and after the two electronic display boards are connected together, they may not need to be connected to each other relying on a bracket. In other words, the requirements for the bracket are relatively flexible.

The electronic display board provided by the embodiments of the present disclosure can be used as an electronic table board placed back-to-back at the conference site instead of two electronic table boards connected through a bracket, so that it can be disassembled more conveniently, and the arrangement of the bracket is also omitted. The electronic display boards provided by the embodiments of the present disclosure can also be applied to various other electronic display scenarios, such as exhibition centers, exhibition halls, museums and other scenarios as electronic exhibition boards, and in public places as electronic billboards, office scenarios or educational scenarios and so on as an electronic workstation board. Of course, it is not limited to the scenarios already existing in the market.

For example, as illustrated in FIG. 1, in the direction perpendicular to the display surface, the outline of the electronic display board 100 is a rectangle or similar rectangle, for example, it has two sets of vertical frames, each set of frames is arranged in parallel, and the electronic display board 100 has four frames, and in the case that the electronic signage is placed in use state, it has an upper frame 101, a left frame 102, a bottom frame 103 and a right frame 104, respectively. The upper frame 101 is parallel to the bottom frame 103, and the left frame 102 is parallel to the right frame 104.

For example, FIG. 3 and FIG. 4 illustrate the first magnetic attraction portion 131 and the second magnetic attraction portion 132, respectively. It can be seen in conjunction with FIG. 1 that the first magnetic attraction portion 131 and the second magnetic attraction portion 132 are sequentially arranged in a direction parallel to the upper frame 101.

The above-mentioned first connecting surface may be a whole surface or a portion of a housing.

In some embodiments, the above-mentioned first connecting surface is a portion of a housing, and the portion is provided with a magnet. It should be noted that, in the case that two electronic display boards are connected to each other, the two first connecting surfaces play a role of bonding and connecting. However, the present disclosure does not limit that the first connecting surface as only playing a connecting role. For example, in the case that the electronic display board is used alone (the description of the electronic display board being used alone is described below), the first connecting surface may not play the connecting role.

For example, in the case that the electronic signage in the using state is placed in the direction of the user facing to the housing, as illustrated in FIG. 1 and FIG. 2, in addition to the first connecting surface 121, the housing 120 further has a left side surface 122 on the side away from the display panel 110, a second connecting surface 123, a right side surface 124 and a middle surface 125. The first connecting surface 121, the left side surface 122, the second connecting surface 123 and the right side surface 124 are respectively connected with the upper frame 101, the left frame 102, the bottom frame 103 and the right frame 104, and all have a certain included angle with the display surface 111. The first connecting surface 121, the left side surface 122, the second connecting surface 123 and the right side surface 124 are arranged around the middle surface 125 and are respectively connected with the middle surface 125. The first connecting surface 121, the left side surface 122, the second connecting surface 123, the right side surface 124 and the middle surface 125 are joined together to form a surface of the housing on the side away from the display panel. For example, the middle plane 125 may be parallel to the display plane 111. For example, the first connecting surface 121 and the second connecting surface 123 are roughly isosceles trapezoidal, and the left side surface 122 and the right side surface 124 are roughly trapezoidal. In this way, as illustrated in FIG. 1, the housing 120 is a roughly left-right symmetrical structure with a symmetrical plane P (for example, a plane perpendicular to the paper at the dotted line in the figure), and the symmetrical plane P is perpendicular to the display surface 111 and the first connecting surface 121, and the distance to the left frame 102 and the right frame 104 is equal. The portions of the housing located on the left side and the right side of the symmetry plane P are roughly symmetrical about the symmetry plane P.

It should be noted that the roughly symmetrical here means that the shapes and structures on the left side and right side of the symmetry plane may be substantially the same, and are not limited to be absolutely the same. The symmetrical structure here means that in the case that two electronic display boards are used for being attached back-to-back, the corresponding connecting or positioning structures can be matched with each other. For example, the left side surface 122 is symmetrical with the right side surface 124, and the left portion of the first connecting surface 121 is symmetrical with the right portion. However, some differences in the details of the left portion and the right portion of the first connecting surface 121 are allowed. For example, hereinafter, the left portion of the first connecting surface 121 has a first protrusion, the right portion has a first groove, and the positions of the first protrusion and the first groove are symmetrical but the shapes are different.

It should be noted that the housing structure illustrated in FIG. 1 and FIG. 2 is only an example, the housing provided by the present disclosure is not limited to the above structure, and the specific structure of the housing can be designed according to actual needs. For example, the middle surface 125 and the display surface 111 may not be parallel. For another example, the housing may not comprise a middle surface, and the surface on the side away from the display panel is formed by splicing the first connecting surface 121, the left side surface 122, the second connecting surface 123 and the right side surface 124. In this case, the connecting surface 121 and the second connecting surface 123 may be isosceles trapezoids, and the left side surface 122 and the right side surface 124 may be triangles. For another example, the housing may also be an asymmetric structure, not including the symmetry plane P.

Figure 27:
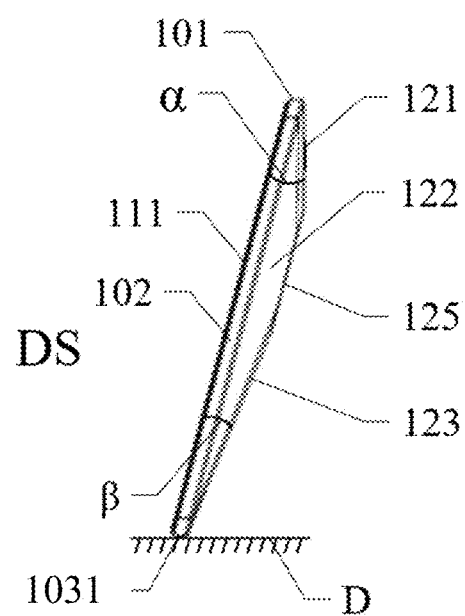

For example, as illustrated in FIG. 2, in some embodiments, the electronic display board can be placed obliquely on a platform such as a desktop D, the bottom frame 103 is in contact with the desktop D, and the upper frame 101 is away from the desktop D. For example, the bottom frame 103 is provided with a groove, and an anti-skid pad 1031, as illustrated in FIG. 27, is provided in the groove to increase the friction force for contacting with the desktop, thereby increasing the friction force with the contact surface and improving the placement stability. For example, the anti-skid pad can be made of materials such as silicone or rubber. For example, in some situations (further described later), the upper frame 101 may also be in contact with the desktop, and the bottom frame 103 may be away from the desktop. In this case, a groove may also be provided in the upper frame 101, and an anti-skid pad is provided in the groove to increase the frictional force for contacting with the desktop, thereby increasing the support stability.

For example, the bottom frame 103 or the upper frame 101 may be provided with one or more grooves, and anti-skid pads may be provided in the grooves. In the case that one groove is provided, the groove is strip-shaped from one side to the other side; in the case that multiple grooves are provided, the plurality of grooves are distributed in dots, and the shape of the grooves can be circular, rectangular or oval.

For example, the bottom frame and the upper frame may not be provided with grooves, and the anti-skid pad is attached to the edge of the bottom frame.

For example, in other embodiments, the electronic display board may also be placed oppositely in the direction from the upper and bottom as illustrated in FIG. 2, that is, the upper frame 101 is in contact with the desktop, and the bottom frame 103 is away from the desktop. For example, a groove may also be provided in the upper frame 101, and an anti-skid pad is provided in the groove to increase the frictional force for contacting with the desktop, thereby increasing the support stability. For example, the anti-skid pad can be made of materials such as silicone or rubber.

The electronic display board may be placed obliquely on the table, which can be realized by two electronic display boards supporting each other, or can be placed independently by setting a bracket on its own housing, the specific structure of which will be further described later.

For example, as illustrated in FIG. 1, FIG. 3 and FIG. 4, the first magnetic attraction portion 131 and the second magnetic attraction portion 132 are two independent magnets, each of which is a bipolar magnet, and the magnetic pole orientations of the two magnets are opposite. For example, as illustrated in FIG. 3, the first magnetic attraction part 131 and the second magnetic attraction part 132 are two magnets whose south pole to north pole are respectively oriented substantially perpendicular to the first connecting surface 121 and opposite to each other. For example, as illustrated in FIG. 3, the N pole of the first magnetic attraction portion 131 is oriented towards the side away from the display panel 110, and the S pole is towards the side close to the display panel 110; as illustrated in FIG. 4, the second magnetic attraction portion 132 has a N pole being oriented towards the side close to the display panel 110, and the S pole is oriented towards the side away from the display panel 110. Of course, the N pole of the first magnetic attraction portion 131 can also be oriented towards the side close to the display panel 110, the S pole can also be oriented towards the side away from the display panel 110, and the N pole of the second magnetic attraction portion 132 can be oriented towards a side away from the display panel 110, and the S pole oriented towards the side close to the display panel 110.

It should be noted that the embodiments of the present disclosure do not limit that the first magnetic attraction portion 131 and the second magnetic attraction portion 132 are two different components. For example, the first magnetic attraction portion 131 and the second magnetic attraction portion 132 may respectively belong to two poles of the same bar magnet. For example, the first magnetic attraction structure may comprise a bar magnet, the N pole portion of the bar magnet is the first magnetic attraction portion 131, and the S pole portion of the bar magnet is the second magnetic attraction portion 132.

It should be noted that, the embodiments of the present disclosure do not limit both the first magnetic attraction portion 131 and the second magnetic attraction portion 132 to be magnets. For example, the first magnetic portion 131 is a magnet, and the second magnetic portion 132 is a component including ferromagnetic material; or, the first magnetic portion 131 is a component including ferromagnetic material, and the second magnetic portion 132 is a magnet. A magnet is a substance that can generate a magnetic field and has two polarities, divided into north and south poles. Ferromagnetic materials refer to materials that can be attracted by magnets, for example, metallic elements such as iron, cobalt, nickel, and gadolinium, or alloys including these metallic elements.

For example, as illustrated in FIG. 1, FIG. 3 and FIG. 4, the electronic display board 100 further comprises a concave and convex positioning structure 140. The concave and convex positioning structure 140 is located at the position where the first connecting surface 121 is located. The concave and convex positioning structure 140 comprises a first protrusion 141 and a first groove 142, and the shape and size of the first protrusion 141 and the first groove 142 are matched with each other.

It should be noted that the shape and size of the first protrusion 141 and the first groove 142 being matched with each other means that the convex shape of the first protrusion 141 is the same as the concave shape of the first groove 142, and the size of the groove is equal to or slightly larger than the size of the first protrusion, so that the first protrusion and the first groove can be engaged with each other to play a positioning role. For example, as illustrated in FIG. 3 and FIG. 4, the cross-sectional shape of the first protrusion is trapezoidal, and the cross-sectional shape of the first groove is also trapezoidal. Of course, the first protrusion and the first groove may also be in other shapes.

The concave and convex positioning structure 140 is used for positioning as connecting two electronic display boards. In the case that two electronic display boards approach each other for docking on the first connecting surface, the concave and convex positioning structure is provided to facilitate the user to find the docking point, and the concave and convex positioning structure can limit the relative sliding of the first connecting surfaces of the two electronic display boards.

For example, the positions of the first protrusion 141 and the first groove 142 may be interchanged, that is, the A-A section is a groove, and the B-B section is a protrusion. In this way, the positioning function of the concave and convex positioning structure 140 can also be achieved.

For example, as illustrated in FIG. 1, the first protrusion 141 and the first grooves 142 are arranged in a direction parallel to the upper frame 101, that is, the center connecting line L of the first protrusions 141 and the first grooves 142 are parallel with the upper frame 101.

For example, as illustrated in FIG. 1, the positions of the first protrusion 141 and the first groove 142 are symmetrical with respect to the symmetry plane P, that is, the distance from the center of the first protrusion 141 to the symmetry plane P and the distance from the center of the first groove 142 to the symmetry plane P is the same, and the distance from the center of the first protrusion 141 to the upper frame 101 is the same as the distance from the center of the first groove 142 to the upper frame 101.

A general display panel is rectangular, with four frames, and an upper frame and a bottom frame are parallel.

In the case that the display panel does not have a frame, the display panel has four sides, and an upper side and a bottom side are parallel. Either way, in the case that the display panel displays a picture, the upper side and the bottom side of the picture correspond to the upper frame and bottom frame, respectively, or the upper side and the bottom side of the picture correspond to the upper side and bottom side of the display panel, respectively.

In some embodiments, the connecting line L between the center of the first protrusion 141 and the center of the first groove 142 is substantially parallel to the upper frame 101 of the display panel or the upper side of the display panel. In other words, the display panel can be used for displaying pictures, and the connecting line L between the center of the first protrusion 141 and the center of the first groove 142 is substantially parallel to the upper side or the bottom side of the picture displayed by the display panel.

For example, in the case that the first included angle α is greater than 0 degrees, the connecting line L between the center of the first protrusion 141 and the center of the first groove 142 is substantially parallel to the intersection line of the plane where the first connecting surface 121 is located and the plane where the display surface 111 is located, and the distances from the midpoint of the connecting line L to the two edges of the electronic display board opposite to each other in the direction of the intersection line are approximately equal to each other.

For example, the first magnetic attraction portion 131 and the second magnetic attraction portion 132 are also substantially symmetrical with respect to the symmetry plane P. For example, in a direction perpendicular to the first connecting surface 121, the first protrusion 141 at least partially overlaps the first magnetic attraction portion 131, and the first groove 142 at least partially overlaps the second magnetic attraction portion 132.

For example, in the case that the first included angle α is greater than 0 degrees, the connecting line between the center of the first magnetic attraction portion 131 and the center of the second magnetic attraction portion 132 is substantially parallel to the intersection line of the plane where the first connecting surface 121 is located and the plane where the display surface 111 is located, and distances from the midpoint of the connecting line to the two edges of the electronic display board opposite to each other in the direction of the intersection line are approximately equal to each other.

For example, as illustrated in FIG. 3 and FIG. 4, in the direction perpendicular to the first connecting surface 121, the orthographic projection of the first protrusion 141 on the first connecting surface 121 falls within the orthographic projection of the first magnetic attraction portion 131 on the first connecting surface 121, the orthographic projection of the first groove 142 on the first connecting surface 121 falls within the orthographic projection of the second magnetic attraction portion 132 on the first connecting surface 121.

It should be noted that, in the direction perpendicular to the first connecting surface 121, the first protrusion 141 and the first magnetic attraction portion 131 may also partially overlap, and the first groove 142 and the second magnetic attraction portion 132 may also partially overlap; or, in the direction perpendicular to the first connecting surface 121, the first protrusion 141 and the first magnetic attraction portion 131 may not overlap, and the first groove 142 and the second magnetic attraction portion 132 may not overlap.

In the case that two identical electronic display boards 100 (for example, marked as 100a, 100b, respectively) are connected through the first connecting surface 121, the first protrusion 141 of the electronic display board 100a and the first groove 142 of the electronic display board 100b correspond to each other, and the first groove 142 of the electronic display board 100a and the first protrusion 141 of the electronic display board 100b correspond to each other. The first magnetic attraction portion 131 of the electronic display board 100a and the second magnetic attraction portion 132 of the electronic display board 100b correspond to each other, and the second magnetic attraction portion 132 of the electronic display board 100a and the first magnetic attraction portion 131 of the electronic display board 100b correspond to each other.

For example, as illustrated in FIG. 3 and FIG. 4, the housing 120 comprises a first installation portion 126 and a second installation portion 127 located on the side near the display panel. The first installation portion 126 is located between the first protrusion 141 and the display panel 110, and the second installation portion 127 is located between the first groove 142 and the display panel 110, the first magnetic attraction portion 131 is installed in the first installation portion 126 and the second magnetic attraction portion 132 is installed in the second installation portion 127. For example, the first installation portion 126 is a groove that fits the shape and size of the first magnetic attraction portion 131, and the first magnetic attraction portion 131 is attached in the first installation portion 126 by double-sided tape or glue; the second installation portion 127 is a groove that fits the shape and size of the second magnetic attraction portion 132, and the second magnetic attraction portion 132 is attached in the second installation portion 132 by double-sided tape or glue in the second installation portion 127.

For example, as illustrated in FIG. 3 and FIG. 4, the electronic display board further comprises a cover plate 150. The cover plate 150 covers the display surface 111 of the display panel 110 to protect the display panel. The cover 150 is a transparent cover, and the material of the transparent cover may be, for example, glass or organic matter.

For example, as illustrated in FIG. 2, the second connecting surface 123 and the display surface 111 have a second included angle $\beta$, and the intersection line of the plane in which the second connecting surface 123 is located and the plane in which the display surface 111 is located is parallel to the intersection line of the plane in which the first connecting surface 121 is located and the plane in which the display surface 111 is located. For example, as illustrated in FIG. 1, the intersection line of the second connecting surface 123 with the display surface 111 can be considered as the bottom frame 103, and the intersection line of the first connecting surface 121 with the display surface 111 can be considered as the upper frame 101. It should be noted that the plane in which one of the above-mentioned surfaces located refers to a plane of infinite size in a broad sense, so the planes in which two non-parallel surfaces located must have an intersection line. For example, in the case that the second connecting surface 123 does not intersect directly with the display surface 111, their intersection line refers to the intersection line of their extension surfaces.

For example, the first included angle $\alpha$ and the second included angle $\beta$ are both acute angles. For example, the first included angle $\alpha$ has a value in the range of 0-45 degrees, and the second included angle $\beta$ has a value in the range of 0-45 degrees. For example, the second included angle $\beta$ is not equal to the first included angle $\alpha$.

For example, the first included angle $\alpha$ has a value in the range of 0-15 degrees, and the second included angle $\beta$ has a value in the range of 0-10 degrees. In this angle range, it is beneficial to make the display panel approximately perpendicular to the viewpoint of the observer, thereby improving the display effect.

For example, the electronic display board 100 can also be provided with a second magnetic attraction structure. The second magnetic attraction structure is fixed to the housing and is located between the second connecting surface 123 and the display panel 110.

The second magnetic attraction structure is arranged similarly to the first magnetic attraction structure. For example, the second magnetic attraction structure comprises a third magnetic attraction portion and a fourth magnetic attraction portion, the third magnetic attraction portion and the fourth magnetic attraction portion are configured to attract each other upon approaching each other; for example, the connecting line between the center of the third magnetic attraction portion and the center of the fourth magnetic attraction portion is approximately parallel to the intersection line between the plane in which the second connecting surface is located and the plane in which the display surface is located, and the distances from the midpoint of the connecting line to the two edges of the electronic display board opposite in the direction of the intersection line are approximately equal to each other. The second magnetic attraction structure will not be described in this embodiment.

The second magnetic attraction structure plays a similar role to the first magnetic attraction structure, and is used to connect the two electronic display boards through the second connecting surface 123.

Similarly, a concave and convex positioning structure can also be provided at the location of the second connecting surface 123. The arrangement and function of the concave and convex positioning structure at the second connecting surface are similar to the concave and convex positioning structure at the first connecting surface, which will not be described in detail in the present disclosure.

By setting the second magnetic attraction structure and the concave and convex positioning structure at the second connecting surface, another connection method of the two electronic display boards is provided, and the two connection methods make the display surface present different tilt angles, which enriches the user's choice.

For example, the electronic display board may also comprise a drive circuit board, located between the housing and the display panel, electrically connected to the display panel, and configured to drive the display panel for display. For example, the electronic display board may further comprise a data interface for connecting the drive circuit board to an external device.

For example, the electronic display board may further comprise a power source, disposed between the housing and the display panel, configured to supply power to the display panel and the driver circuit board. For example, since the space between the middle surface 125 and the display panel 110 is the largest, the power source may be provided between the middle surface 125 and the display panel 110. For example, the power source may be a rechargeable battery, and the electronic display board may further comprise a charging interface. For example, the power source may be a disposable battery, and the electronic display board further comprises a battery replacement interface.

For example, the electronic display board may also use an external power source, and the electronic display board comprises a power source interface.

For example, in the electronic display board provided in the above embodiments, the display panel may be an electronic ink screen, electronic paper, etc. The electronic ink screen and the electronic paper have an advantage of saving power. The electronic paper comprises various types of display panels such as electrophoretic display (EPD) panels, rotating ball display panels, bistable liquid crystal panels, electric wetting displays and fast response electronic powder fluid display panels. For example, the display panel can be an electrophoretic display panel.

The electronic ink screen and the electronic paper have the advantages of light weight and small thickness. An important application scenario of the electronic display board provided by the embodiments of the present disclosure is the electronic table board, which is used to display information such as the names of participants, and other functions that are too complicated are not needed most of the time. In the case that an electronic display board according to an embodiment of the present disclosure selects the electronic ink screen or the electronic paper, the advantages of light weight and power saving of the electronic ink screen and electronic paper are complementary to the portability due to using the magnetic attraction structure to attract each other for support. Therefore, some embodiments of the present disclosure can bring further convenience to the electronic display board through the cooperation of the electronic paper and the magnetic attraction structure.

Of course, the display panel may also be a liquid crystal display (LCD) panel or an organic light emitting diode (OLED) display panel. The liquid crystal display panel or the organic light emitting diode display panel can realize other functions such as touch control. The type of the display panel can be selected as required, which is not limited in the present disclosure.

An embodiment of the present disclosure also provides a snap type electronic display board. Similar to the above-mentioned electronic display board structure, the snap type electronic display board comprises: a display panel with a display surface on the display side; a housing connected with the display panel and having a first connecting surface on the non-display side of the display panel, the first connecting surface and the display surface have an included angle therebetween. Different from the above-mentioned electronic display board, the snap type electronic display board comprises a buckle structure, which is located on the first connecting surface, and the buckle structure comprises a male buckle and a female buckle that cooperate with each other. For the setting position of the buckle structure, reference may be made to the setting position of the above-mentioned first magnetic attraction structure or the second magnetic attraction structure, which will not be described in this embodiment.

The snap type electronic display board provided by the embodiments of the present disclosure can realize the effect of connecting two snap type electronic display boards together through the buckle structure, and the two snap type electronic display boards can support each other after being connected together, thereby being placed stably on a platform such as a desktop or the ground.

The snap type electronic display board provided by the embodiments of the present disclosure can be used as an electronic table board at the conference site to replace the traditional paper table board, which can save resources and facilitate the replacement of display information. The snap type electronic display boards provided by the embodiments of the present disclosure can also be applied to various other electronic display scenarios, for example, as electronic exhibition boards, electronic billboards, and electronic workstation boards.

Figure 5:
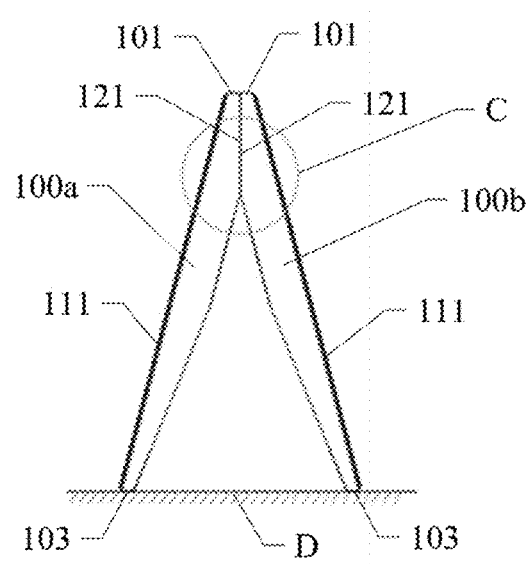
FIG. 5 is a structural schematic diagram of an electronic display board system according to an embodiment of the present disclosure.

An embodiment of the present disclosure also provides an electronic display board system. FIG. 5 is a schematic structural diagram of the electronic display board system. Each electronic display board in the electronic display board system is an electronic display board introduced in any one of the above embodiments of this application, and the description content of the above electronic display board is applicable to any one of the following embodiments.

As illustrated in FIG. 5, the double-sided electronic display board comprises two identical electronic display boards 100a and 100b, the display surfaces 111 of the two electronic display boards 100a and 100b are away from each other, the first connecting surfaces 121 are attached to each other, and the upper frames 101 of the two electronic display boards are aligned with each other, and the two first connecting surfaces 121 are attracted together by the first magnetic attraction structure, thereby forming an electronic display board that can be displayed on both sides without using a bracket.

In some embodiments, the sizes of the two electronic displayed table boards may be different, as long as each electronic displayed table board is provided with a magnetic attraction structure behind it to make it attractive to each other.

In some implementations, a buckle structure for concave and convex matching may or may not be provided behind the two electronic display table boards. For electronic display boards with light size and weight, the buckle structure may not be provided.

As illustrated in FIG. 5, viewed along the extending direction of the upper frame 101, the first connecting surfaces 121 of the two electronic display boards support each other, the bottom frames 103 of the two electronic display boards are in contact with the desktop D, and the display surfaces 111 of the two electronic display boards and the desktop D form a substantially isosceles triangle. In this way, the electronic display board system can be stably placed on a platform such as a desktop. The two display surfaces have an included angle of $2\alpha$ therebewteen.

Figure 6:
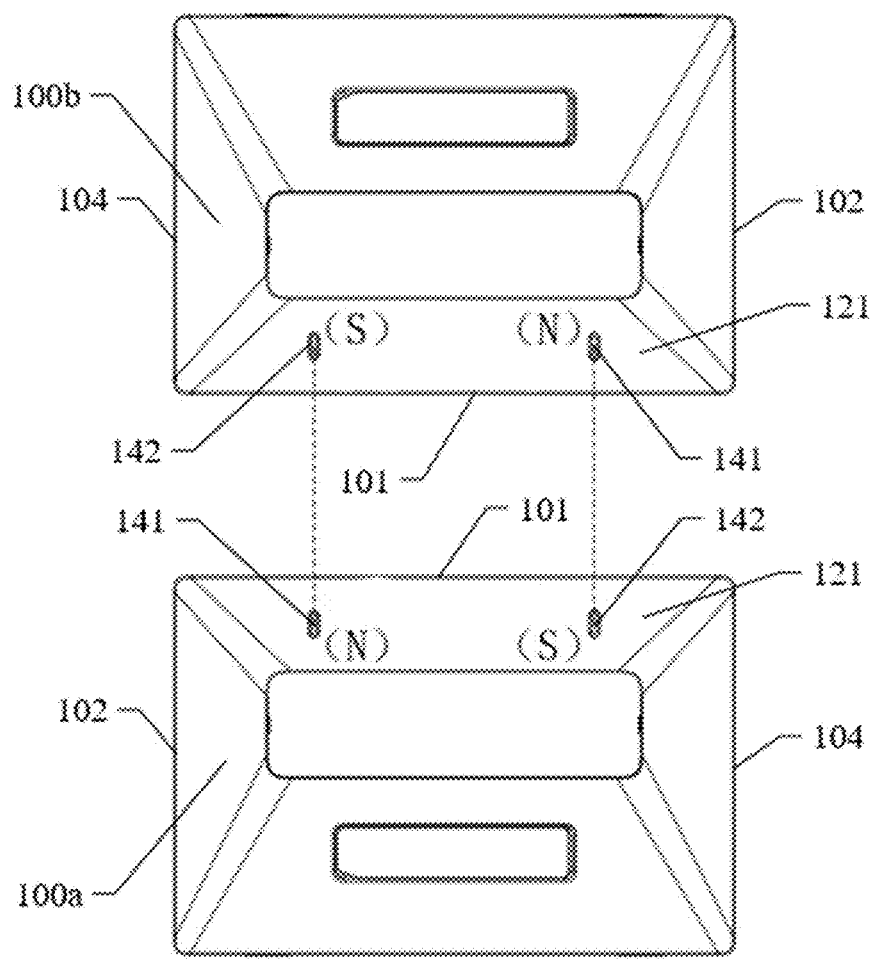
FIG. 6 is a connection correspondence diagram of two electronic display boards of an electronic display board system according to an embodiment of the present disclosure.

FIG. 6 is a connection correspondence diagram of two electronic display boards of an electronic display board system. As illustrated in FIG. 6, since the positions of the first protrusion 141 and the first groove 142 are symmetrical with respect to the symmetry plane P, after the two electronic display boards are connected to each other at the first connecting surface 121, the upper frame 101 of the electronic display board 100a is aligned with the upper frame 101 of the electronic display board 100b, the left frame 102 of the electronic display board 100a is aligned with the right frame 104 of the electronic display board 100b, and the right frame 104 of the electronic display board 100a is aligned with the left frame 102 of the electronic display board 100b, so that the electronic display board system is more beautiful and neat.

After the first connecting surfaces 121 of the two electronic display boards are sucked together, in the case that they need to be disassembled, if two pulling forces in opposite directions and perpendicular to the first connecting surfaces are directly applied, the required pulling force may be large and it lacks suitable force application point, the electronic display board is vulnerable to be damaged.

Figure 7:
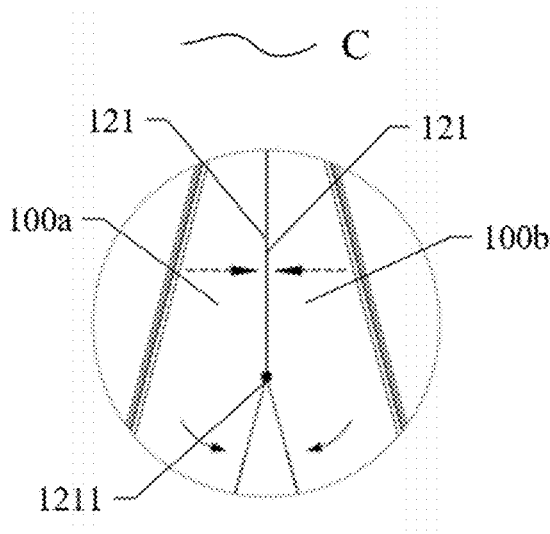
FIG. 7 is the enlarged structure schematic diagram at C in FIG. 5.

FIG. 7 is the enlarged structure schematic diagram at C in FIG. 5, illustrating a disassembly method of the electronic display board system. In the case that the electronic display board system needs to be disassembled, the method illustrated in FIG. 7 can be used, taking the overlapping edge 1211 of the two first connecting surfaces 121 as the fulcrum, applying force to the electronic display board 100a and the electronic display board 100b respectively in the direction of the arrows of solid lines in the figure, according to the lever principle, the first connecting surfaces can be easily separated from the upper portion.

Similarly, the two overlapping edges of the upper frame 101 can also be used as fulcrum to apply forces opposite to the direction of the arrows of solid lines in FIG. 7 to the electronic display board 100a and the electronic display board 100b respectively. According to the lever principle, the first connecting surfaces can be easily separated from the bottom portion.

Figure 8:
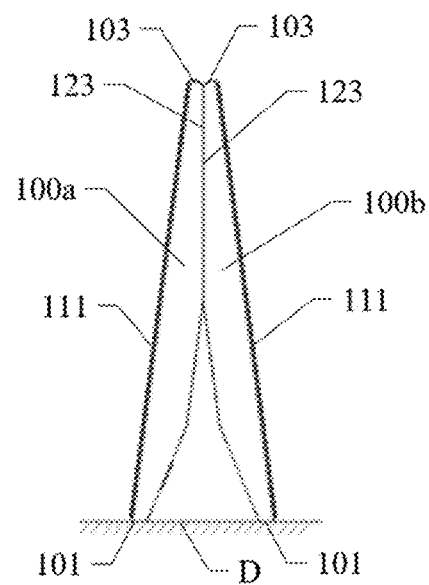
FIG. 8 is another structural schematic diagram of an electronic display board system according to an embodiment of the present disclosure.

For the electronic display board with the second magnetic attraction structure, the electronic display board system can also be connected to each other through the second magnetic attraction structure at the position where the second connecting surface 123 is located, and the structure of the electronic display board system is illustrated in FIG. 8. The display surfaces 111 of the electronic display board 100*a* and the electronic display board 100*b* are away from each other, the second connecting surfaces 123 are attached to each other, and the bottom frames 103 of the two electronic display boards are aligned, and the two second connecting surfaces 123 are joined together by the second magnetic attraction structure, thereby forming an electronic display board with double-sided display.

Viewed along the extending direction of the upper frame 101, and the second connecting surfaces 123 of the two electronic display boards support each other. The upper frames 101 of the two electronic display boards contacts with the desktop D, and the two display surfaces 111 of the electronic display board system and the desktop D form a roughly isosceles triangle. In this way, the electronic display board system can be stably placed on a platform such as a desktop. The two display surfaces have an included angle of 2β.

By setting the first connecting surface and the second connecting surface, the connection methods of the electronic display board system are increased, and the two connection methods make the two display surfaces present different tilt angles, which enhances the scene applicability of the electronic display board system.

The first connecting surface and the second connecting surface are used for connection in the double-sided display system, but in a single-side display, the connecting surface is not used for connection, and is only a portion or the whole of the housing.

It should be noted that the present disclosure has stated that the upper and bottom are only relative positional relationships. In the embodiments of the present disclosure, the upper frame may be positioned above or below, which is set according to actual needs, which is not limited in the present disclosure.

The electronic display board system provided by the embodiments of the present disclosure can be used as an electronic table board at the conference site to replace the traditional paper table board, which can save resources and facilitate the replacement of display information. Two electronic display boards are connected, and their display surfaces are away from each other, so that double-sided display can be realized. For example, for a participant, the display surface facing the outside of the double-sided display electronic table board in front of him can display his own name and other information, while the display surface facing the participant can display various information, such as the conference theme, content and so on. Moreover, when no work is required, the electronic display board system can be easily split into two relatively thin electronic display boards, which saves the occupied space and is facilitate to storage and transportation.

Moreover, the electronic display boards provided by the embodiments of the present disclosure can also be applied to various other electronic display scenarios, such as stand-placed electronic exhibition boards, electronic billboards, information display boards, electronic workstation boards, and so on.

An embodiment of the present disclosure also provides a snap type electronic display board system. It comprises two snap type electronic display boards, and the two snap type electronic display boards are connected by a male buckle and a female buckle that cooperate with each other. Its technical effect is the same as the above-mentioned magnetic attraction electronic display board system.

Figure 9:
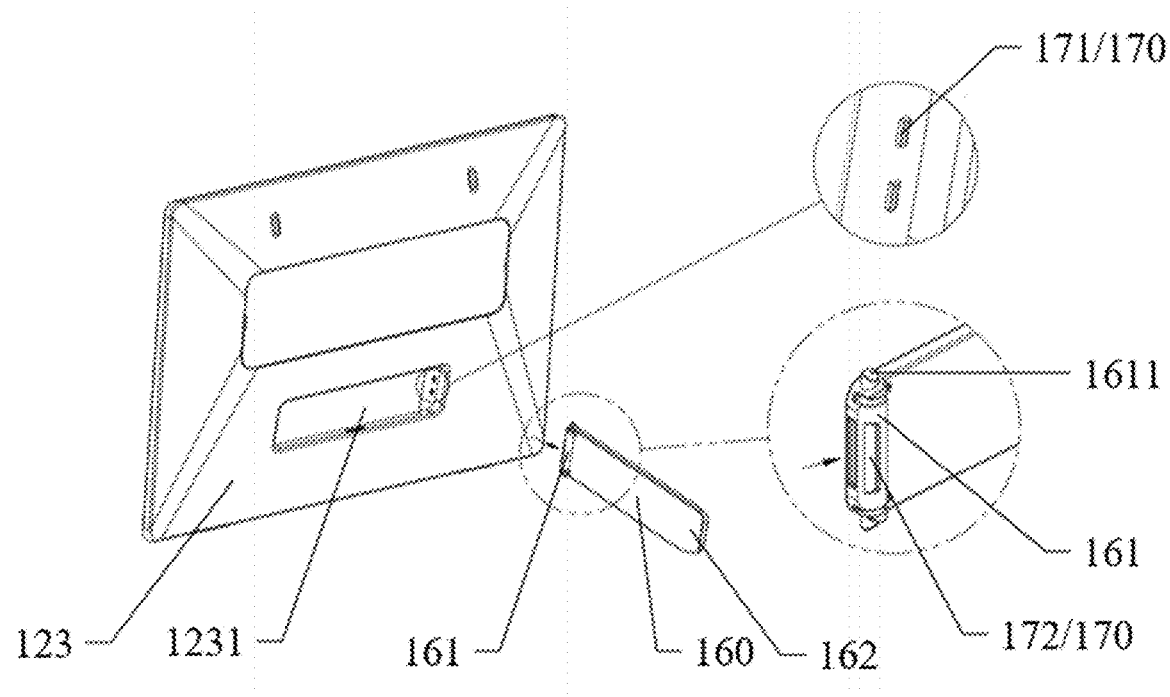
FIG. 9 is a structure schematic diagram of a three-dimensional explosion of an electronic display board according to an embodiment of the present disclosure.

FIG. 9 is a structure schematic diagram of a three-dimensional explosion of an electronic display board, and comprises a three-dimensional enlarged schematic diagram of a partial structure. For example, as illustrated in FIG. 1 and FIG. 9, the electronic display board 100 further comprises a bracket 160. For example, the bracket 160 is a generally rectangular plate-shape member. The bracket 160 comprises a rotation shaft 1611 at a first end portion 161, the bracket 160 is hinged with the housing 120 through the rotation shaft 1611, and the bracket 160 can rotate relative to the housing. For example, the bracket and the housing are hinged at the position where the second connecting surface 123 is located.

For example, the bracket 160 has a first position and a second position as it rotates relative to the housing, and the first position is the position where the second end portion 162 of the bracket opposite to the first end portion 161 is close to the second connecting surface 123, which can also be called folding position; the second position is the position where the second end portion of the bracket is away from the second connecting surface, which can also be called the unfolding position.

Figure 10:
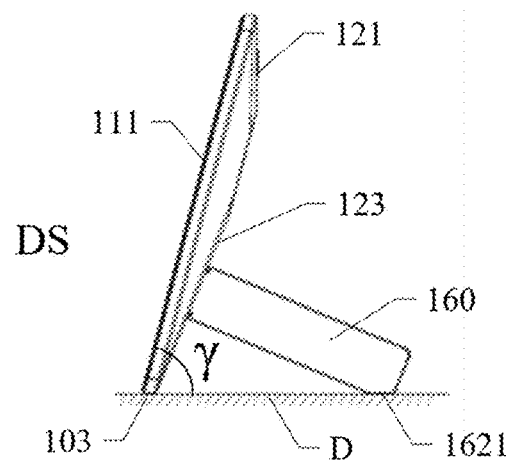
FIG. 10 is another schematic diagram of a plane structure of an electronic display board according to an embodiment of the present disclosure.

FIG. 10 is another schematic diagram of a plane structure of an electronic display board, illustrating the structure of the bracket in the second position. In the case that the bracket is in the first position, its structure is illustrated in FIG. 1 and FIG. 2; in the case that the bracket is in the second position, its structure is illustrated in FIG. 10.

For example, as illustrated in FIG. 1 and FIG. 9, the housing has a receiving groove 1231 recessed toward the display surface 111 at the second connecting surface 123. In the case that the bracket 160 is in the first position, as illustrated in FIG. 1 and FIG. 2, the bracket is located in the receiving groove, and the surface of the bracket away from the display surface is flush with the second connecting surface 123, so that the surface of the housing is flat and beautiful. Of course, the surface of the bracket away from the display surface 111 may also be located on the side of the second connecting surface 123 close to or away from the display surface 111.

For example, in the case that the bracket 160 is in the second position, the plane where the bracket 160 is located is perpendicular to the second connecting surface 123. Of course, this is only an example, and in the case that the bracket is in the second position, the plane on which the bracket is located may not be perpendicular to the second connecting surface. The included angle between the plane where the bracket is located and the second connecting surface can be designed according to actual needs.

Figure 11:
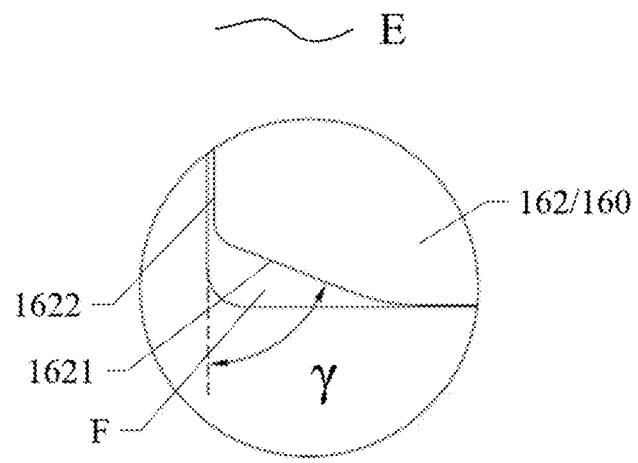
FIG. 11 is the enlarged structure schematic diagram at E in FIG. 1.

FIG. 11 is the enlarged structure schematic diagram at E in FIG. 1. As illustrated in FIG. 11, the bracket 160 has an inclined surface 1621 at a corner of a second end portion 162 away from the first connecting surface 121, and the inclined surface 1621 has an inclined angle γ relative to an end surface 1622 of the second end portion 162.

For example, in the case that the bracket is in the second position, the inclined surface 1621 and the edge of the electronic display board away from the first connecting surface 121 (positioned close to or coincident with the bottom frame 103) are substantially in the same plane.

For example, as illustrated in FIG. 10, in the case that the bracket is in the second position, the inclined surface 1621 and the desktop D are located on the same plane. In this way, it is beneficial to increase the support stability of the bracket.

For example, in the case that the bracket 160 is in the second position, the plane where the bracket 160 is located is perpendicular to the second connecting surface 123, and the tilt angle γ of the inclined surface 1621 relative to the end surface 1622 is equal to the angle between the display surface 111 and the desktop D. In the state that the bracket 160 is in the second position, the plane on which the bracket 160 is located is not perpendicular to the second connecting surface 123, the tilt angle γ of the inclined surface 1621 relative to the end surface 1622 is not equal to the angle between the display surface 111 and the desktop D, and the value of tilt angle γ can be calculated according to the angle between the plane where the bracket 160 is located and the second connecting surface 123, so that in the state that the bracket is in the second position, the inclined surface 1621 and the desktop D are on the same plane.

For example, as illustrated in FIG. 11, in the state that the bracket 160 is in the first position, in the direction perpendicular to the second connecting surface 123, the receiving groove 1231 has a region F that is not blocked by the bracket 160. In other words, in the state that the bracket is in the first position, the receiving groove 1231 has a space not occupied by the bracket 160 at the inclined surface 1621 of the bracket 160. In other words, the orthographic projection of the bracket on the second connecting surface is within the orthographic projection of the receiving groove on the second connecting surface. Setting the region F is convenient for the user to pull out the bracket from the receiving groove to unfold the bracket. It should be noted that the orthographic projection of the bracket on the second connecting surface being within the orthographic projection of the receiving groove on the second connecting surface means that the orthographic projection of the main body portion of the bracket on the second connecting surface is within the orthographic projection of the receiving groove on the second connecting surface. However, the orthographic projection of the local detail structure of the bracket on the second connecting surface is allowed to be outside the orthographic projection of the receiving groove on the second connecting surface. For example, as illustrated in FIG. 9, the orthographic projection of the rotation shaft 1611 at the first end portion of the bracket on the second connecting surface 123 may be outside the orthographic projection of the receiving groove 1231 on the second connecting surface 123.

Figure 12:
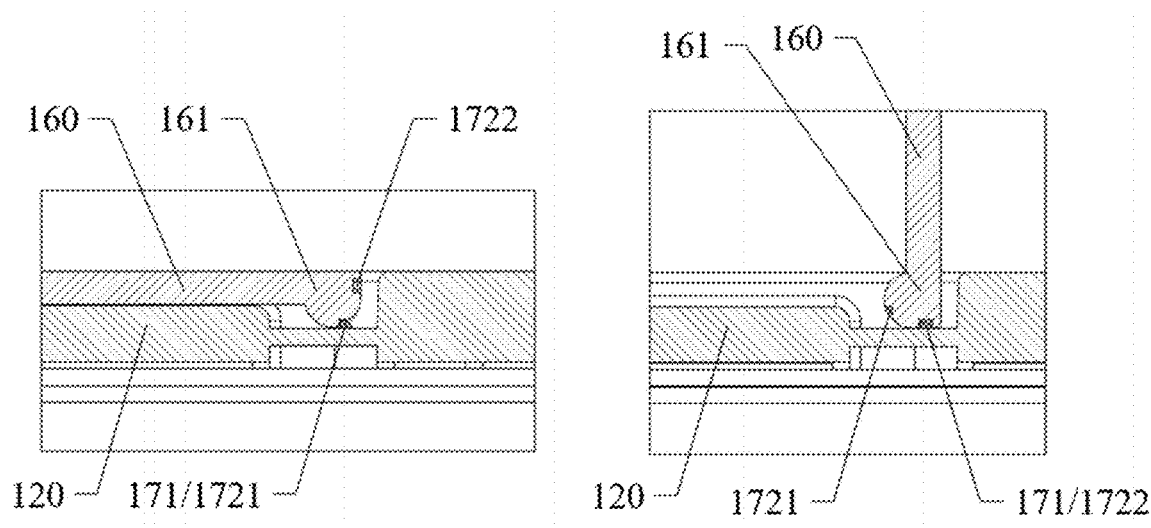
FIG. 12 is a partial cross-sectional structural schematic diagram of an electronic display board according to an embodiment of the present disclosure.

For example, the electronic display board 100 further comprises a limiting device 170 configured to fix the bracket 160 in the folded position and the unfolded position, respectively. FIG. 12 is a partial cross-sectional structural schematic diagram of an electronic display board, showing the structure of the limiting device 170. The left diagram of FIG. 12 illustrates the structure in the case that the bracket 160 is in the folded position, and the right diagram of FIG. 12 illustrates the structure in the case that the bracket 160 is in the unfolded position.

As illustrated in FIG. 9 and FIG. 12, the limiting device 170 comprises a second protrusion 171 and a second groove 172, and the shape and size of the second protrusion and the second groove are matched. The shape and size of the second protrusion and the second groove are matched here, which is similar to the meaning of the matching of the first protrusion and the first groove in the previous paragraph, which means that the second protrusion and the second groove can be engaged with each other to play a positioning role.

For example, as illustrated in FIG. 9 and FIG. 12, the second protrusion 171 is located at the position where the second connecting surface 123 of the case 120 is located, and the second groove 172 is located at the surface of the first end portion 161. For example, the second protrusion 171 and the housing 120 may be integrally formed.

For example, as illustrated in FIG. 9, the second protrusion 171 may be divided into two spaced sections. Of course, the second protrusion 171 may also be divided into more spaced sections, as long as the engagement with the second groove 172 can be achieved, which is not limited in the present disclosure.

For example, as illustrated in FIG. 9 and FIG. 12, the second groove 172 comprises a first sub-groove 1721 and a second sub-groove 1722, both of which are located on the surface of the first end portion 161, the first sub-groove 1721 and the second sub-groove 1722 are distributed in a 90-degree rotation around the central axis of the rotation shaft 1611. The first sub-groove 1721 and the second sub-groove 1722 can be respectively engaged with the second protrusion 171 to define the folded position and the unfolded position of the bracket. As illustrated in the left diagram of FIG. 12, in the case that the bracket is in the folded position, the second protrusion 171 is engaged with the first sub-groove 1721 to ensure the stability of the folded position; as illustrated in the right diagram of FIG. 12, in the case that the bracket is in the unfolded position, the second protrusion 171 is engaged with the second sub-groove 1722 to ensure the stability of the unfolded position. Of Course, the first sub-groove 1721 and the second sub-groove 1722 may also be distributed at other angles around the central axis of the rotation shaft 1611, which are not limited in the present disclosure. In addition, the specific structures of the first sub-groove 1721 and the second sub-groove 1722 may be different, and specific structural parameters thereof may be designed through force analysis, which is not limited in the present disclosure.

For example, the material of the case 120 is a material with certain structural strength and strong elastic deformation ability, such as plastic. For example, as illustrated in FIG. 12, the thickness of the position where the second protrusion 171 is provided on the housing is smaller than the thickness of other positions of the housing. In this way, in the case that the bracket moves back and forth between the folded position and the unfolded position, the position where the second protrusion 171 is arranged on the housing is prone to elastic deformation, which is helpful to improve the service life of the limiting device.

Of course, the arrangement position of the second protrusion 171 and the second groove 172 can be interchanged, that is, the second protrusion 171 can also be located on the surface of the first end portion 161, and the second groove 172 can be located at a position where the second connecting surface 123 is located. In this case, the second protrusion 171 may comprise a first sub-protrusion and a second sub-protrusion, both of which are located on the surface of the first end portion 161, and the two second protrusions 171 rotationally distribute and form a certain angle around the central axis of the rotation shaft 1611, the first sub-protrusion and the second sub-protrusion can be respectively engaged with the second groove 172 to define the first position and the second position of the bracket. For the specific structures of the first sub-protrusion, the second sub-protrusion and the second groove, reference may be made to the above, which are not limited in the present disclosure.

Figure 13:
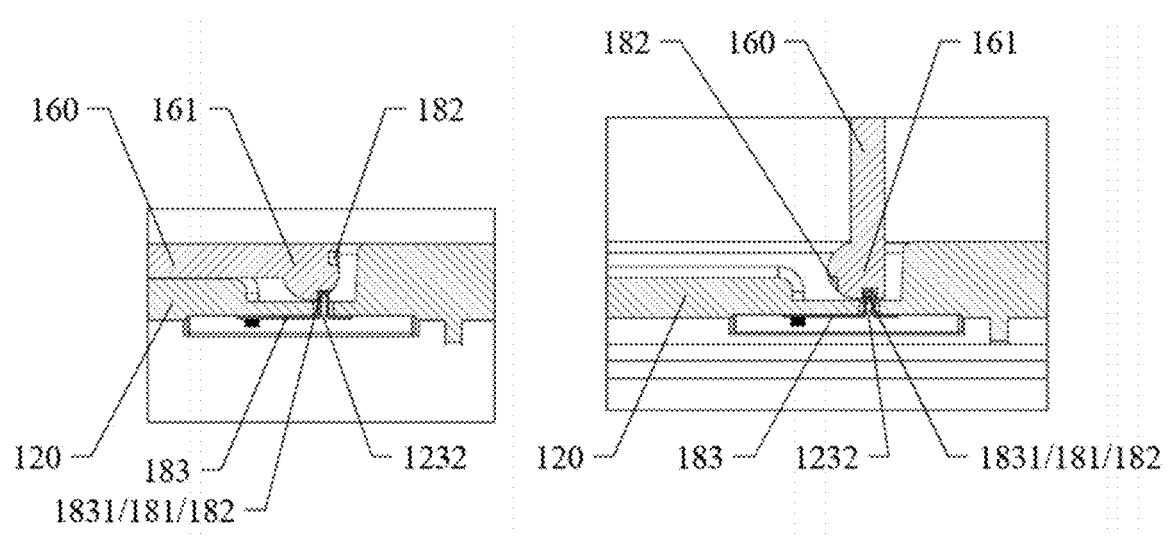
FIG. 13 is a partial cross-sectional structural schematic diagram of another electronic display board according to an embodiment of the present disclosure.
Figure 14:
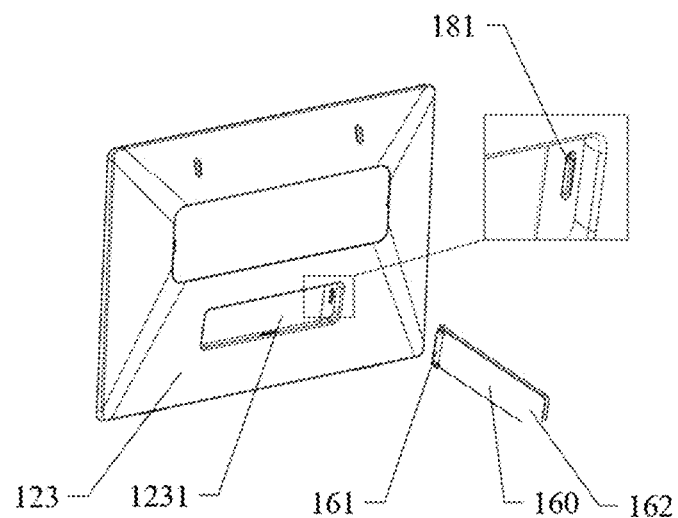
FIG. 14 is a partial cross-sectional structural schematic diagram of another electronic display board according to an embodiment of the present disclosure.
Figure 15:
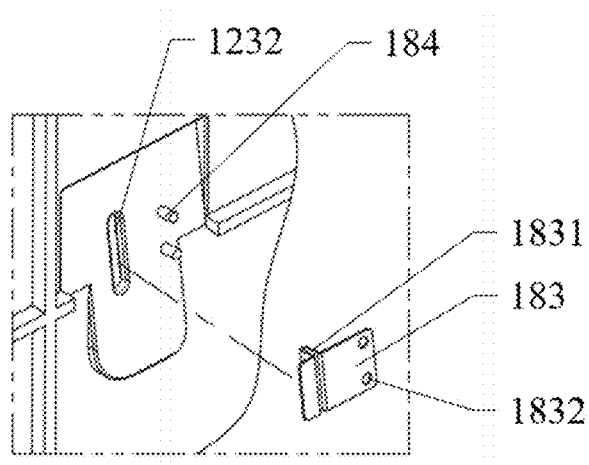
FIG. 15 is a partial structural schematic diagram of a limiting device according to an embodiment of the present disclosure.

An embodiment of the present disclosure provides another limiting device 180. FIG. 13-FIG. 15 illustrate the structure of the limiting device. FIG. 13 is a partial cross-sectional structural schematic diagram of another electronic display board according to an embodiment of the present disclosure, FIG. 14 is a partial cross-sectional structural schematic diagram of another electronic display board according to an embodiment of the present disclosure, FIG. 15 is a partial structural schematic diagram of a limiting device according to an embodiment of the present disclosure.

As illustrated in FIG. 13, similar to the limiting device 170 illustrated in FIG. 12, the limiting device 180 comprises a second protrusion 181 and a second groove 182. The difference between the limiting device 180 and the limiting device 170 illustrated in FIG. 12 is that the second protrusion 181 of the limiting device 180 is different from the second protrusion 171 of the limiting device 170.

As illustrated in FIG. 13, the housing 120 is provided with an opening 1232 at a position corresponding to the second groove 182. The limiting device 180 further comprises an elastic piece 183 with a folding protrusion 1831, and the elastic piece is fixed on the surface of the housing on the side away from the bracket. In the direction perpendicular to the second connecting surface 123, the folding protrusion 1831 protrude from the side of the housing close to the display surface to the side of the housing away from the display surface, and the height of the folding protrusion 1831 is greater than the thickness of the corresponding position of the housing, the folding protrusion 1831 pass through the opening 1232 to form the second protrusion 181.

For example, as illustrated in FIG. 15, the elastic piece 183 comprises a connection hole 1832, and the limiting device 180 further comprises a connection column 184, which is located on the surface of the housing 120 away from the bracket 160. After passing through the connection hole 1832 of the elastic piece 183, the connection column 184 is hot melted or riveted, so that elastic piece 183 is fixed on the surface of housing 120 away from bracket 160. For example, the connection hole 1832 is located on one side of the elastic piece 183, which forms a cantilever structure after the connection hole is fixed to the connection column. In this way, the elastic piece is easy to generate elastic deformation when subjected to pressure, so as to realize the engagement or separation of folding protrusion 1831 and the second groove 182.

For example, the second groove 182 of the limiting device 180 and the second groove 172 of the limiting device 170 may be the same, which will not be described in the present disclosure.

Figure 16:
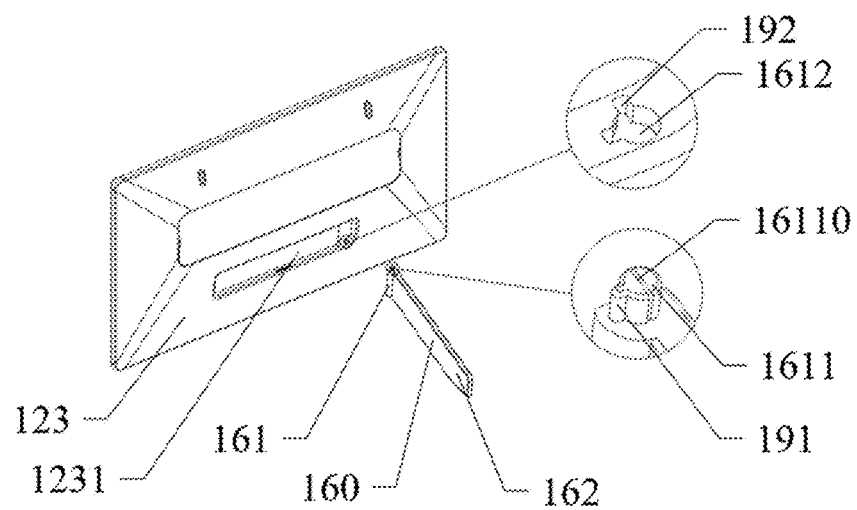
FIG. 16 is a structure schematic diagram of a three-dimensional explosion of another electronic display board according to an embodiment of the present disclosure.
Figure 17:
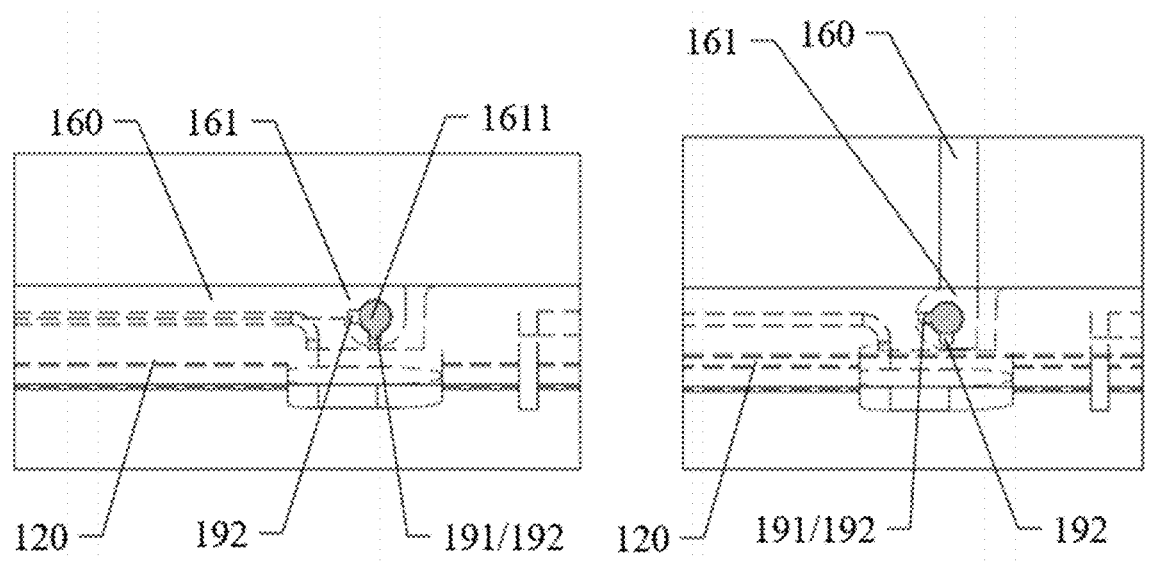
FIG. 17 is a partial structural schematic diagram of a limiting device according to an embodiment of the present disclosure.

An embodiment of the present disclosure provides another limiting device 190. FIG. 16 and FIG. 17 illustrate the structure of the limiting device. FIG. 16 is a structure schematic diagram of a three-dimensional explosion of another electronic display board, FIG. 17 is a partial structural schematic diagram of a limiting device.

As illustrated in FIG. 16 and FIG. 17, the limiting device 190 comprises a second protrusion 191 and a second groove 192. The upper and bottom portions of the first end portion 161 of the bracket 160 are respectively provided with a rotation shaft 1611, and the portions of the housing 120 corresponding to the rotation shaft 1611 have a rotation hole 1612 matched with the rotation shaft 1611. The rotation shaft 1611 is matched with the rotation shaft 1612, and the rotation shaft 1611 is located in the rotation shaft 1612. The second protrusion 191 is located on the rotation shaft 1611, and the second groove 192 is located on the wall surface of the rotation hole 1612.

For example, as illustrated in FIG. 16, the rotation shaft 1611 comprises a crack 16110, which divides the rotation shaft into two spaced portions, and the second protrusion 191 is located on one of the portions. In this way, in the case that the second protrusion 191 is under pressure, elastic deformation is easily generated, so as to realize the engagement or separation of the second protrusion 191 and the second groove 192.

For example, the second groove 192 comprises a first sub-groove and a second sub-groove, and its structure and function are similar to the first sub-groove 1721 and the second sub-groove 1722 illustrated in FIG. 12, which will not be described in the present disclosure.

By arranging the bracket 160 at the second connecting surface of the housing, the scene adaptability of the electronic display board can be further enhanced. For example, two electronic display boards can be connected by a magnetic attraction structure to form an electronic display board system, the two electronic display boards are supported by each other, and the bracket can be in a folded state; a single electronic display board can be used alone, just need to unfold the bracket as a support. It is convenient for single use or double-sided display.

For example, in the case that the second magnetic attraction structure is provided at the second connecting surface, the position of the receiving groove 1231 for accommodating the bracket 160 and the position of the second magnetic attraction structure can be staggered from each other to reduce mutual interference. For example, the bracket and the receiving groove are located on the side of the second magnetic attraction structure away from the bottom frame; alternatively, in a direction parallel to the bottom frame, the third magnetic attraction portion and the fourth magnetic attraction portion of the second magnetic attraction structure are located on both sides of the bracket and the receiving groove, respectively.

Figure 18:
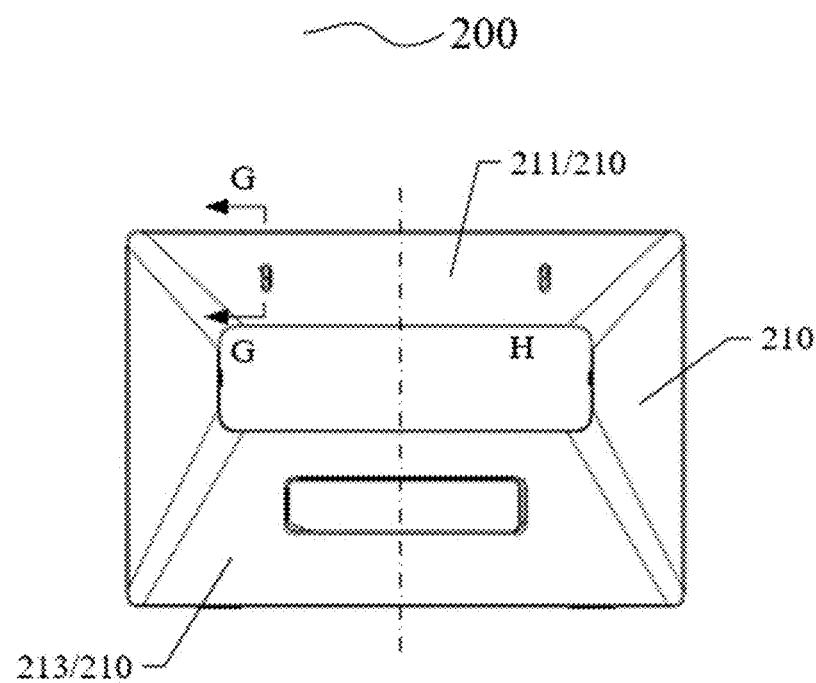
FIG. 18 is a schematic diagram of a plane structure of a supporting structure according to an embodiment of the present disclosure.
Figure 19:
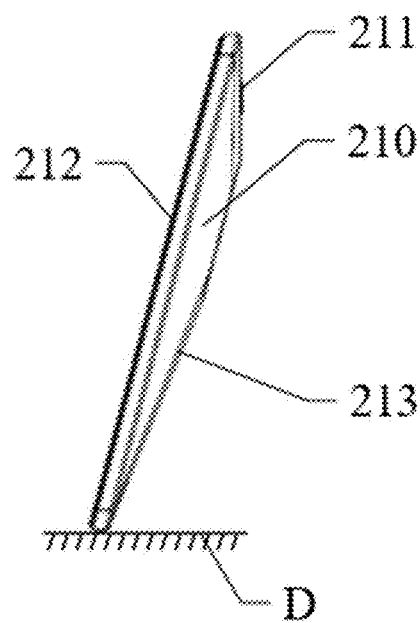
FIG. 19 is another schematic diagram of a plane structure of a supporting structure according to an embodiment of the present disclosure.

An embodiment of the present disclosure further provides a supporting structure 200. The supporting structure 200 is similar in structure to the electronic display board 100, but does not comprise a display panel. FIG. 18 and FIG. 19 are two schematic diagrams of a plane structure of the supporting structure, and FIG. 20 is a partial cross-sectional structural schematic diagram taken along the line G-G of FIG. 18.

Figure 20:
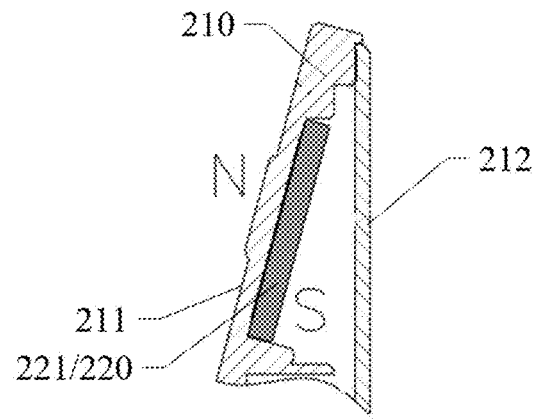
FIG. 20 is a partial cross-sectional structural schematic diagram taken along the line G-G of FIG. 18.

As illustrated in FIG. 18-FIG. 20, the supporting structure 200 comprises: a support main body portion 210 and a first magnetic attraction structure 220. One side of the supporting main body portion 210 has a structure similar to that of the side of the above-mentioned housing 120 away from the display panel, and has a first connecting surface 211; the other side of the support main body portion 210 has a supporting surface 212, the first connecting surface 211 and the supporting surface 212 has an included angle. The first magnetic attraction structure 220 is fixed on the side of the first connecting surface 211 close to the supporting surface 212. The first magnetic attraction structure 220 comprises a first magnetic attraction portion 221 and a second magnetic attraction portion 222, and first magnetic attraction portion 221 and the second magnetic attraction portion 222 are configured to attract each other in the case that they are close to each other.

It should be noted that the supporting surface 212 is configured to support the object to be supported or connected on the supporting structure. For example, as a bracket for paper table boards, the supporting surface can be a flat surface on which paper can be placed, and the edge of the supporting surface can comprise limit blocks to limit the position of the paper. The supporting surface is not limited to be a planar structure, for example, the supporting surface may also comprise an opening, and the opening is used to support the object to be supported. Its specific structure can be designed according to the structure of the object to be supported.

For example, similar to the structure of the electronic display board 100, the supporting structure may further comprise a concave and convex positioning structure on the first connecting surface.

For example, similar to the structure of the electronic display board 100, the supporting structure may further comprise a second connecting surface, and a second magnetic attraction structure, a bracket, and the like located on the second connecting surface.

Figure 21:
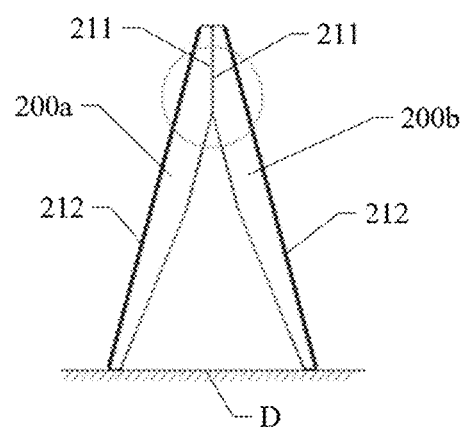
FIG. 21 is a schematic diagram of a plane structure of a support platform according to an embodiment of the present disclosure.

An embodiment of the present disclosure further provides a support platform, and FIG. 21 is a schematic diagram of a plane structure of a support platform. As illustrated in FIG. 21, similar to the structure of the electronic display board system, the support platform comprises two same supporting structures as above, for example, 200a and 200b. The supporting surfaces 212 of the two supporting structures face away from each other, and the first connecting surfaces 211 of the two supporting structures are connected through the first magnetic attraction structure.

For example, the first magnetic attraction portion of one of the two supporting structures and the second magnetic attraction portion of the other one of the two supporting structures attract each other in the case that they are close to each other, and the second magnetic attraction portion of one of the two supporting structures and the second magnetic attraction portion of the other one of the two supporting structures attract each other in the case that they are close to each other.

In the support platform provided by the embodiments of the present disclosure, the two supporting structures can support each other after being connected together by the first magnetic attraction structure, so as to be stably placed on a platform such as a desktop or the ground to be used as a supporting structure, two surfaces of which may all be used to support the object to be supported. And upon not being used, it can be easily separated into two thinner supporting structures, which saves occupied space and facilitates storage and transportation.

An embodiment of the present disclosure further provides an electronic display board, including: a display panel having a display surface on a display side; a housing connected to the display panel; a bracket located on a side of the bracket away from the display side and is hinged with the housing by a hinged shaft and can be rotated around the hinged shaft; and a limiting device, configured to limit the rotation range of the bracket.

For example, the structure of the display panel, the housing, the bracket and the limiting device of the electronic display board may refer to the electronic display board provided by the above-mentioned embodiments, which will not be described in the present disclosure. The electronic display board can be used alone, and upon being placed on the table, it is supported by the bracket.

An embodiment of the present disclosure further provides a supporting structure, comprising: a support main body portion; a bracket, located on one side of the support main body portion, hinged with the support main body portion through a hinge shaft, and rotatable around the hinge shaft; and a limiting device configured to limit the rotation range of the bracket.

For example, for the structure of the supporting main body portion, the bracket and the limiting device of the supporting structure, reference may be made to the supporting structure provided in the above-mentioned embodiments, which will not be described in the present disclosure. The supporting structure can be used alone, and upon being placed on a tabletop, it is supported by the bracket.

Figure 22:
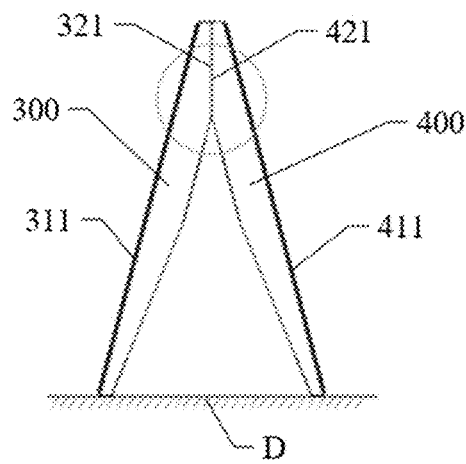
FIG. 22 is a schematic diagram of a plane structure of another electronic display board system according to an embodiment of the present disclosure.

An embodiment of the present disclosure also provides an electronic display board system. As illustrated in FIG. 22, the electronic display board system comprises a first electronic display board 300 and a second electronic display board 400.

For example, the number of the first electronic display boards 300 is one or more, and the display sides of the one or more first electronic display boards face towards the same direction.

The number of the second electronic display boards 400 is one or more, and the display side of the one or more second electronic display boards and the first electronic display boards 300 face towards opposite directions.

The first electronic display board 300 and the second electronic display board 400 are used to distinguish the electronic display boards in two directions, and are not used to limit the number and region.

The size of one or more of the first electronic display boards 300 may be exactly identical or partially identical.

The size of one or more of the second electronic display boards 400 may be exactly identical or partially identical.

In the case that the first electronic display board and the second electronic display board are placed back-to-back, the first magnetic attraction structure and the second magnetic attraction structure are configured to attract each other upon approaching each other.

In the above embodiment, the housing may be a housing independent of the display panel, and the material thereof may be metal or plastic. In addition, the housing can also be integrated with the display panel, or in other words, the housing can also be a portion of the display panel. For example, the housing is the housing on the side of the display panel opposite to the display surface, and the housing of the display panel may be the housing of the electronic ink screen or the housing of the LCD display backlight module. The shape of the housing is not limited, and can be a structure with a layer to protect the internal components, such as metal or plastic.

At this time, the case is the outer surface of the display panel, the first magnetic attraction structure or the second magnetic attraction structure is located inside the outer surface of the display panel, or the first magnetic attraction structure or the second magnetic attraction structure is located between the display surface and the housing of the display panel.

Figure 23:
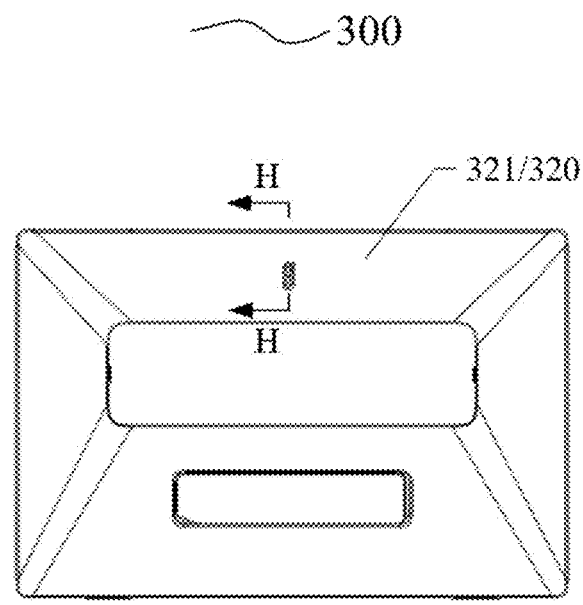
FIG. 23 is a schematic diagram of a plane structure of a first electronic display board system according to an embodiment of the present disclosure.
Figure 24:
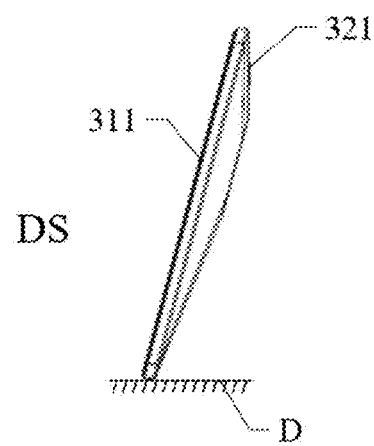
FIG. 24 is another schematic diagram of a plane structure of a first electronic display board according to an embodiment of the present disclosure.
Figure 25:
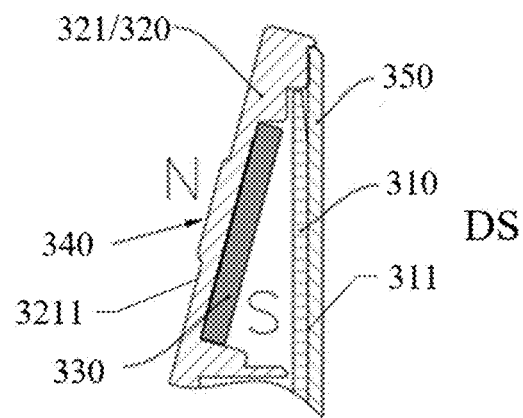
FIG. 25 is a partial cross-sectional structural schematic diagram taken along the line H-H of FIG. 23.

FIG. 23 is an embodiment of the first electronic display board for one, FIG. 23 is a schematic diagram of a plane structure of the first electronic display board, FIG. 24 is a schematic diagram of a plane structure of the first electronic display board from another perspective, FIG. 25 is a partial cross-sectional structural schematic diagram taken along the line H-H of FIG. 23.

FIG. 23-FIG. 25 illustrate the embodiment in which the first electronic display board has a number of one, and the first electronic display board 300 comprises: a display panel 310; a housing 320, connected to the display panel 310, comprising a housing main body portion 321 located on the non-display side of display panel 310; and a first magnetic attraction structure 330, located between the housing main body portion 321 and the display panel 310.

In the embodiment in which the second electronic display board 400 has a number of one, the structure of the second electronic display board 400 can refer to the first electronic display board 300, and also comprises: a display panel; a housing, connected with the display panel, including a housing main body portion on the non-display side of the display panel; and a second magnetic attraction structure, located between the housing main body portion and the display panel.

The first magnetic attraction structure and the second magnetic attraction structure are configured to attract each other upon approaching each other.

The difference between the second electronic display board 400 and the first electronic display board 300 is that the second magnetic attraction structure is different from the first magnetic attraction structure. For example, the first magnetic attraction structure and the second magnetic attraction structure are both magnets, the N pole of the first magnetic attraction structure faces towards the side away from the display panel, and the S pole of the second magnetic attraction structure is towards the side away from the display panel. Alternatively, the S pole of the first magnetic attraction structure is towards the side away from the display panel, and the N pole of the second magnetic attraction structure is towards the side away from the display panel. For another example, the first magnetic attraction structure is a magnet, and the second magnetic attraction structure is a component of ferromagnetic material; or, the second magnetic attraction structure is a magnet, and the first magnetic attraction structure is a component of ferromagnetic material. With the above arrangement, it can be achieved that the first magnetic attraction structure and the second magnetic attraction structure attract each other in the case that they are close to each other.

For example, the structures of the first electronic display board 300 and the second electronic display board 400 are similar to the electronic display board 100 illustrated in FIG. 1-FIG. 4, and may also comprise a matching concave and convex positioning structures. In addition, other positioning structures are also possible, for example, the positioning structures on the electronic display board 300 and the electronic display board 400 are different. For example, the first electronic display board 300 comprises a convex positioning structure, and the second electronic display board 400 comprises a concave positioning structure; or, the first electronic display board 300 comprises a concave positioning structure, and the second electronic display board 400 comprises a convex positioning structure.

In addition, other portions of the first electronic display board 300 and the second electronic display board 400, for example, structures such as brackets, may also have the same structures as those in the above-described embodiments, which will not be repeated here.

Figure 26:
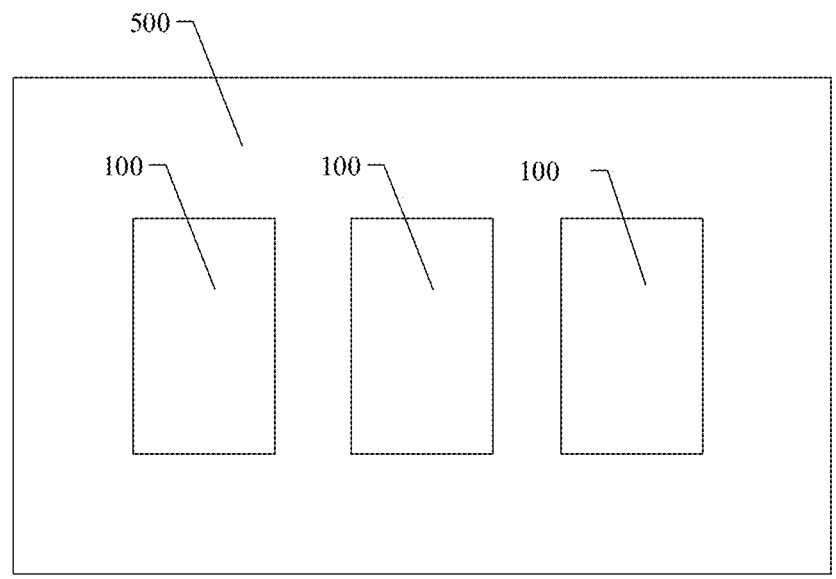
FIG. 26 is a schematic diagram of another electronic display board system according to an embodiment of the present disclosure and FIG. 27 is another schematic diagram of a plane structure of an electronic display board according to an embodiment of the present disclosure.

In some embodiments, the electronic display board system comprises a plurality of the above-mentioned electronic display boards 100, and the plurality of electronic display boards are attracted together and supported by the above-mentioned magnetic attraction structure. FIG. 26 is a schematic diagram of an electronic display board system. For example, an electronic display board system may comprise three electronic display boards. Of course, the electronic display board system may also comprise more electronic display boards, which is not limited in the present disclosure. For example, as illustrated in FIG. 26, three electronic display boards 100 are respectively attached to another electronic display device or electronic display board 500 back-to-back by any of the above-mentioned magnetic attraction methods. In the embodiment here, three electronic display boards 100 are attached to another electronic display device or electronic display board 500 by magnetic attraction, but the embodiment of the present disclosure is not limited to this, and two or more than four electronic display boards may by attached to another electronic display device or electronic display board through magnetic attraction.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

The foregoing is only the preferred embodiments of the present disclosure and not intended to limit the scope of protection of the present disclosure. Any change or replacement that may be easily thought of by those skilled in the art within the technical scope disclosed by the present disclosure shall fall within the scope of protection of the present disclosure. Therefore, the scope of protection of the present disclosure shall be defined by the appended claims.

What is claimed is:

1. An electronic display board system, comprising two electronic display boards, wherein each of the electronic display boards comprises:
   a display panel, comprising a display surface on a display side, wherein the display panel is an electronic ink screen, configured to display information;
   a housing, connected to the display panel, and comprising a connecting surface on a side away from the display panel, the connecting surface and the display surface having a non-zero first angle or being arranged in parallel; and
   a magnetic attraction structure, located between the connecting surface and the display panel, and comprising a first magnetic attraction portion and a second magnetic attraction portion,
   wherein a first magnetic attraction portion of one of the two electronic display boards and a second magnetic attraction portion of the other one of the two electronic display boards are configured to attract each other upon approaching each other, a second magnetic attraction portion of the one of the two electronic display boards and a first magnetic attraction portion of the other one of the two electronic display boards are configured to attract each other upon approaching each other, and the magnetic attraction structure has a distance from a portion where the housing is connected to the display panel, and the magnetic attraction structure is completely located between the display panel and the housing in position,
   wherein the two electronic display boards are connected, and the display surfaces of the two electronic display boards are away from each other.

2. An electronic display board, used for connecting with another electronic display board through magnetic attraction, comprising:
   a display panel, comprising a display surface on a display side, wherein the display panel is an electronic ink screen, configured to display information;
   a housing, connected to the display panel, and comprising a first connecting surface on a side away from the display panel, the first connecting surface and the display surface having a non-zero first included angle or being arranged in parallel;
   a first magnetic attraction structure, located between the first connecting surface and the display panel, the first magnetic attraction structure comprising a first magnetic attraction portion and a second magnetic attraction portion, the first magnetic attraction portion is configured for mutual attraction with a second magnetic attraction portion of the another electronic display board upon approaching it, and the second magnetic attraction portion is configured for mutual attraction with a first magnetic attraction portion of the another electronic display board upon approaching it, and the first magnetic attraction structure has a distance from a portion where the housing is connected to the display panel; and
- a bracket, comprising a rotation shaft at a first end portion, and hinged with the housing through the rotation shaft at a second connecting surface, wherein the housing comprises a receiving groove, recessed toward the display surface at the second connecting surface, in a state that the bracket is at a first position the bracket is located in the receiving groove, and a surface of the bracket away from the display surface is flush with the second connecting surface,
- wherein the electronic display board and the another electronic display board are connected, and the display surface of the electronic display board and a display surface of the another electronic display board are away from each other.

3. The electronic display board according to claim 2, further comprising:
- a positioning structure, located on a side of the first connecting surface away from the display panel, the positioning structure comprising a first protrusion and a first groove, the first protrusion having a shape and a size matched with those of the first groove.

4. The electronic display board according to claim 3, wherein the display panel is configured to display an image, and a connecting line between a center of the first protrusion and a center of the first groove is substantially parallel to an upper side of the image, distances from a midpoint of the connecting line to two edges of the electronic display board opposite to each other in a direction of the upper side are approximately equal to each other.

5. The electronic display board according to claim 2, wherein the display panel is configured to display an image, a connecting line between a center of the first magnetic attraction portion and a center of the second magnetic attraction portion is substantially parallel to an upper side of the image, and distances from a midpoint of the connecting line to two edges of the electronic display board opposite to each other in a direction of the upper side are approximately equal to each other.

6. The electronic display board according to claim 3, wherein, in a direction perpendicular to the first connecting surface, the first protrusion at least partially overlaps the first magnetic attraction portion, and the first groove at least partially overlaps the second magnetic attraction portion.

7. The electronic display board according to claim 6, wherein, in the direction perpendicular to the first connecting surface, an orthographic projection of the first protrusion on the first connecting surface falls within an orthographic projection of the first magnetic attraction portion on the first connecting surface, and an orthographic projection of the first groove on the first connecting surface falls within an orthographic projection of the second magnetic attraction portion on the first connecting surface.

8. The electronic display board according to claim 2, wherein the first included angle has a value in a range greater than 0 degrees and less than or equal to 45 degrees.

9. The electronic display board according to claim 2, wherein the first magnetic attraction portion and the second magnetic attraction portion are two magnets which have south pole-to-north pole orientations substantially perpendicular to the first connecting surface and opposite to each other; or, the first magnetic attraction portion and the second magnetic attraction portion are two poles of a same bar magnet; or, the first magnetic attraction portion and the second magnetic attraction portion are respectively a magnet and a component comprising a ferromagnetic material.

10. The electronic display board according to claim 2, wherein the housing further comprises a second connecting surface on a surface of the housing away from the display panel, the second connecting surface and the display surface have a second included angle β, and an intersection line of a plane in which the second connecting surface is located and a plane in which the display surface is located is parallel to an intersection line of a plane in which the first connecting surface is located and a plane in which the display surface is located,
- wherein the electronic display board further comprises a second magnetic attraction structure, fixed to the housing and located between the second connecting surface and the display panel, the second magnetic attraction structure comprising a third magnetic attraction portion and a fourth magnetic attraction portion, configured to attract each other upon approaching each other.

11. The electronic display board according to claim 10, further comprising:
- a limiting device, configured to fix the bracket at the first position and a second position, wherein the first position is a position where a second end portion of the bracket opposite to the first end portion is close to the second connecting surface, and the second position is a position where the second end portion of the bracket is away from the second connecting surface.

12. The electronic display board according to claim 11, wherein the limiting device comprises a second protrusion and a second groove, the second protrusion has a shape and a size matched with those of the second groove, the second protrusion is located at one of a surface of the first end portion of the bracket and the housing, and the second groove is located at the other one of the surface of the first end portion of the bracket and the housing.

13. The electronic display board according to claim 12, wherein the second groove is located at the surface of the first end portion of the bracket, and comprises a first sub-groove and a second sub-groove, the first sub-groove and the second sub-groove are rotationally distributed in 90-degrees around the rotation shaft, and are respectively matched with the second protrusion to define the first position and the second position of the bracket.

14. The electronic display board according to claim 12, wherein the second protrusion is located on the housing, the housing comprises an opening at a position corresponding to the second protrusion, and the second protrusion comprises a folding elastic piece protruding through the opening from a side of the housing away from the second connecting surface to the second connecting surface.

15. The electronic display board according to claim 11, wherein the housing comprises a rotation hole, and at least part of the rotation shaft is located in the rotation hole, a second protrusion is located on the rotation shaft, and a second groove is located on a wall surface of the rotation hole.

16. The electronic display board according to claim 15, wherein the second groove comprises a first sub-groove and a second sub-groove, the first sub-groove and the second sub-groove are rotationally distributed in 90-degrees around the rotation shaft, and are respectively matched with the second protrusion to define the first position and the second position of the bracket.

17. The electronic display board according to claim 11, wherein an orthographic projection of the bracket on the second connecting surface is within an orthographic projection of the receiving groove on the second connecting surface.

18. The electronic display board according to claim 17, wherein the bracket comprises an inclined surface at a corner of the second end portion away from the first connecting surface, in a state that the bracket is at the second position, the inclined surface and an edge of the electronic display board away from the first connecting surface are substantially in a same plane.

19. The electronic display board according to claim 10, wherein at least one of a portion where the display surface is connected to the first connection surface and a portion where the display surface is connected to the second connection surface has an anti-skid pad.

20. A support platform, comprising: two supporting structures, wherein each of the supporting structures comprises:
a support main body portion, comprising a connecting surface and a supporting surface, the connecting surface and the supporting surface having an included angle; and
a magnetic attraction structure, fixed on a side of the connecting surface close to the supporting surface, comprising a first magnetic attraction portion and a second magnetic attraction portion,
wherein a first magnetic attraction portion of one of the two supporting structures and a second magnetic attraction portion of the other one of the two supporting structures are configured to attract each other upon approaching each other, and a second magnetic attraction portion of the one of the two supporting structures and a second magnetic attraction portion of the other one of the two supporting structures are configured to attract each other upon approaching each other, the connecting surface is connected to the supporting surface and the magnetic attraction structure has a distance from a portion where the connecting surface is connected to the supporting surface, the connecting surfaces of the two supporting structures contact with each other, and both of the connecting surfaces are flat surfaces,
wherein the support main body portion of each of the two supporting structures is configured to support a display panel, and a display surface of the display panel of the one of the two supporting structures and a display surface of the other one of the two supporting structures are away from each other.

* * * * *